United States Patent
Lai et al.

(10) Patent No.: US 7,959,819 B2
(45) Date of Patent: Jun. 14, 2011

(54) METHOD AND APPARATUS FOR REDUCING ASPECT RATIO DEPENDENT ETCHING IN TIME DIVISION MULTIPLEXED ETCH PROCESSES

(76) Inventors: Shouliang Lai, Tampa, FL (US); David Johnson, Palm Harbor, FL (US); Russell Westerman, Largo, FL (US)

( * ) Notice: Subject to any disclaimer, the term of this patent is extended or adjusted under 35 U.S.C. 154(b) by 1487 days.

(21) Appl. No.: 11/159,415

(22) Filed: Jun. 23, 2005

(65) Prior Publication Data
US 2005/0287815 A1 Dec. 29, 2005

Related U.S. Application Data

(60) Provisional application No. 60/584,470, filed on Jun. 29, 2004.

(51) Int. Cl.
*G01L 21/30* (2006.01)
*G01R 31/00* (2006.01)
(52) U.S. Cl. ............ 216/59; 216/74; 216/79; 216/67; 438/710
(58) Field of Classification Search ............ 438/700, 438/702, 706, 710, 714, 719, 723, 724, 725; 216/67, 74, 79
See application file for complete search history.

(56) References Cited

U.S. PATENT DOCUMENTS

| | | | |
|---|---|---|---|
| 4,579,623 A | 4/1986 | Suzuki et al. | |
| 4,795,529 A | 1/1989 | Kawasaki et al. | |
| 5,242,539 A | 9/1993 | Kumihashi et al. | |
| 5,474,650 A | 12/1995 | Kumihashi et al. | |
| 5,501,893 A | 3/1996 | Laermer et al. | |
| 5,650,038 A | 7/1997 | Kumihashi et al. | |
| 5,795,832 A | 8/1998 | Kumihashi et al. | |
| 6,008,133 A | 12/1999 | Kumihashi et al. | |
| 6,136,721 A | 10/2000 | Kumihashi et al. | |
| 6,187,685 B1 * | 2/2001 | Hopkins et al. | 438/710 |
| 6,284,666 B1 * | 9/2001 | Naeem et al. | 438/713 |
| 6,287,980 B1 | 9/2001 | Hanazaki et al. | |
| 6,291,357 B1 | 9/2001 | Zhang et al. | |
| 6,333,273 B1 | 12/2001 | Kumihashi et al. | |
| 6,562,722 B2 | 5/2003 | Kumihashi et al. | |
| 6,632,321 B2 | 10/2003 | Lill et al. | |

(Continued)

FOREIGN PATENT DOCUMENTS
WO WO 00/26956 5/2000

OTHER PUBLICATIONS

The Black Silicon Method VI: High Aspect Ratio Trench Etching for MEMS Applications; Henri Jansen, Meint de Boer, Miko El Wenspoek, Micro Electro Mechanical Systems, 1996, p. 250-257.

(Continued)

*Primary Examiner* — Nadine G Norton
*Assistant Examiner* — Mahmoud Dahimene
(74) *Attorney, Agent, or Firm* — Harvey S. Kauget; Phelps Dunbar LLP

(57) ABSTRACT

The present invention provides a method and an apparatus for reducing aspect ratio dependent etching that is observed when plasma etching deep trenches in a semiconductor substrate through an alternating deposition/etch process. A plurality of different sized features on the substrate are monitored in real time during the alternating deposition/etch process. Then, based on the information received from the monitor, at least one process parameter is adjusted in the alternating deposition/etch process to achieve equivalent etch depths of at least two different sized features on the substrate.

4 Claims, 22 Drawing Sheets

U.S. PATENT DOCUMENTS

| | | | |
|---|---|---|---|
| 6,720,268 B1 * | 4/2004 | Laermer et al. | 438/700 |
| 6,793,765 B1 | 9/2004 | Labelle et al. | |
| 6,815,345 B2 | 11/2004 | Zhao et al. | |
| 2003/0003607 A1 | 1/2003 | Kagoshima et al. | |
| 2003/0026934 A1 * | 2/2003 | Damon | 428/43 |
| 2003/0043383 A1 * | 3/2003 | Usui et al. | 356/504 |
| 2003/0052084 A1 | 3/2003 | Tabery et al. | |
| 2003/0171000 A1 | 9/2003 | Chung et al. | |
| 2004/0038139 A1 | 2/2004 | Mui et al. | |
| 2004/0055995 A1 * | 3/2004 | Westerman et al. | 216/2 |
| 2004/0084406 A1 | 5/2004 | Kamp et al. | |
| 2004/0152302 A1 | 8/2004 | Wang et al. | |
| 2004/0161941 A1 * | 8/2004 | Donohoe et al. | 438/709 |
| 2005/0112891 A1 * | 5/2005 | Johnson et al. | 438/691 |

OTHER PUBLICATIONS

SPIE Conference Microelectronic & MEMS Technologies, Edinburgh (UK) May 2001.

Journal of Electrochem. Soc. 146(1) 339-349 (1999) Ayon et al.

Rickard, et al., Charecterisation and optimisation of deep dry etching for MEMS application, Proceedings of the SPIE—The International Society for Optical Engineering SPIE—Soc. Opt. Eng USA, vol. 4407, 2001, pp. 78-88.

Amary P et al., A new sensor for trench depth monitoring: the TDM 200, Proceedings of the SPIE—The International Society for Optical Engineering SPEI—Int. Soc. Opt. Eng USA, vol. 5343, No. 1, 2003, pp. 244-254.

* cited by examiner

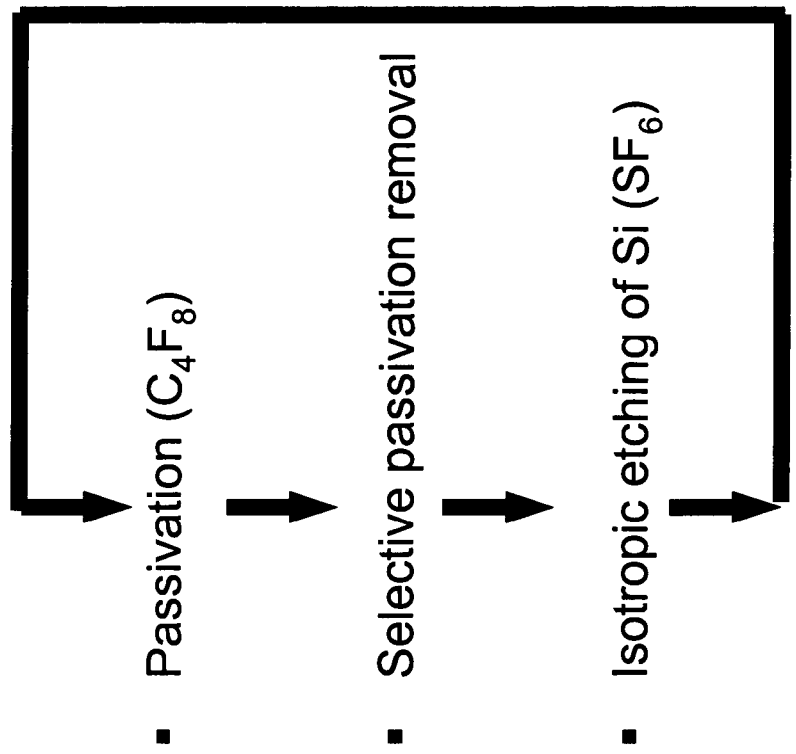
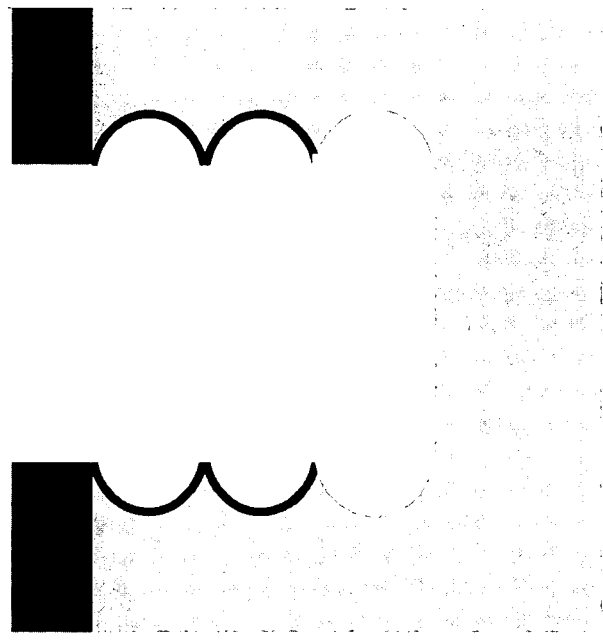
Figure 1

Feature Etch Depth vs Feature Width

Figure 13
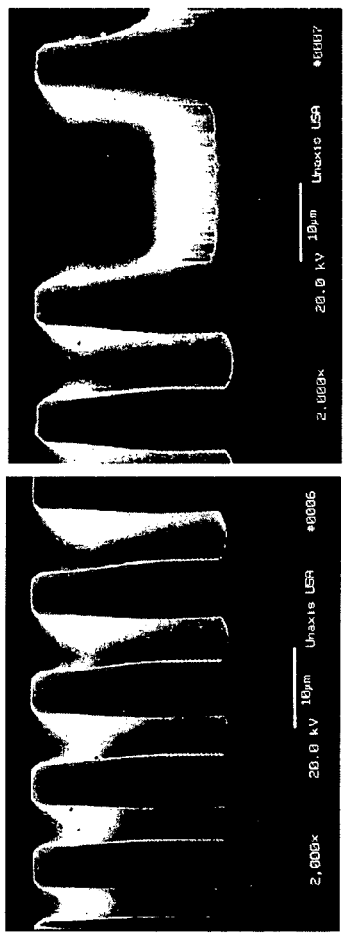 E. Inverse ARDE
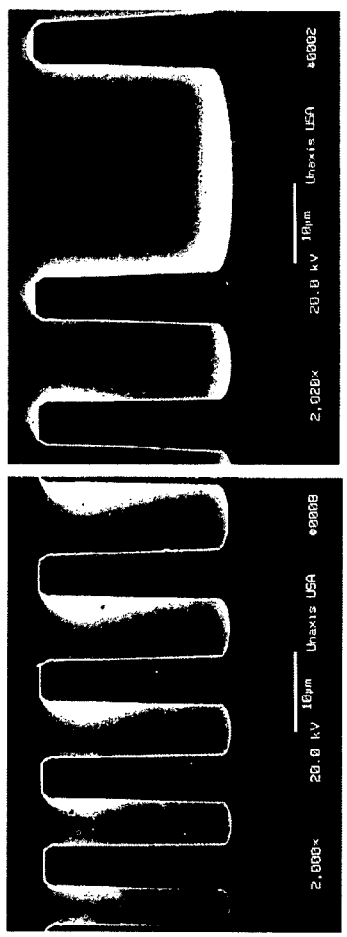 F. Minimal ARDE
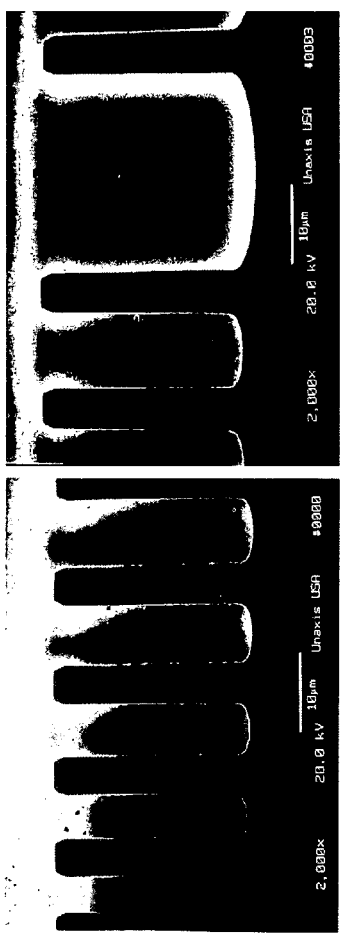 G. ARDE Etch Depth vs Feature Size EDD = Etch Depth Difference

METHOD AND APPARATUS FOR REDUCING ASPECT RATIO DEPENDENT ETCHING IN TIME DIVISION MULTIPLEXED ETCH PROCESSES

CROSS REFERENCES TO RELATED APPLICATIONS

This application claims priority from and is related to commonly owned U.S. Provisional Patent Application Ser. No. 60/584,470 filed Jun. 29, 2004, entitled: A Method and Apparatus for Reducing Aspect Ratio Dependent Etching in Time Division Multiplexed Etch Processes, this Provisional Patent Application incorporated by reference herein.

FIELD OF THE INVENTION

This invention relates to a method and apparatus for plasma etching a feature in a substrate. More particularly, the present invention relates to the reduction of aspect ratio dependent etching in the manufacture of high aspect ratio silicon structures by controlling the alternating deposition and etching steps used to etch these structures.

BACKGROUND OF THE INVENTION

The fabrication of three-dimensional structures in silicon is used extensively in the manufacture of micro-electro-mechanical (MEMS) devices. Often such structures have high aspect ratios (AR) and depths ranging from tens to hundreds of micrometers. Moreover, most of device design requires structures with different dimensions and thus different ARs to co-exist on a single microchip.

Numerous processing techniques have been applied to fabricate three-dimensional microstructures. Dry etching using a reactive gas in the plasma state is one of the more commonly employed processes for silicon etching. A time division multiplexed (TDM) plasma etching technique, which has been described by Suzuki et al. (U.S. Pat. No. 4,579,623), Kawasaki et al. (U.S. Pat. No. 4,795,529) and Laermer et al. (U.S. Pat. No. 5,501,893) is typically used for MEMs applications. The TDM etch process is typically carried out in a reactor configured with a high-density plasma source and a radio-frequency (RF) biased substrate electrode. TDM etch processes employ alternating etching and deposition steps. For example, in etching a silicon substrate, sulfur hexafluoride ($SF_6$) is used as the etch gas and octofluorocyclobutane ($C_4F_8$) as the deposition gas. In an etch step, $SF_6$ facilitates spontaneous and isotropic etching of silicon; in a deposition step, $C_4F_8$ facilitates protective polymer passivation onto the sidewalls as well as the bottom of etched structures. In the subsequent etching step, upon energetic and directional ion bombardment, the polymer film coated in the bottom of etched structures from the preceding deposition step will be removed to expose the silicon surface for further etching. The polymer film on the sidewall will remain, inhibiting lateral etching. The TDM processes cyclically alternate between etch and deposition process steps to enable high aspect ratio structures to be defined into a masked silicon substrate at high etch rates. FIG. 1 provides a schematic illustration for TDM etch processes.

TDM processes consist of multiple steps. A group of steps (e.g., etch and deposition) is called a cycle. Two or more "repeats" of a cycle is called a loop. As multiple cycles are sequentially executed in a loop, it is known in the art to make small changes in the step recipe parameters to enhance profile control (e.g., morphing). In the morphed case, a loop will consist of a series to two or more cycles wherein the steps within a cycle are not strictly identical cycle to cycle. The steps within a cycle may be further divided into one or more sub-steps (e.g., the etch step can be subdivided into a polymer removal sub-step and an isotropic silicon etch sub-step).

There is a well-documented aspect ratio dependent etching (ARDE) phenomenon in deep silicon etching. It has been observed that the silicon etch rate decreases as the depth or aspect ratio (defined as the feature depth divided by the feature width) increases. During the fabrication of three dimensional structures, the ARDE effect can be manifested in two ways. First, as an etch process proceeds for a feature of constant width, the feature aspect ratio increases with increasing etch time resulting in an etch rate decrease over time. Second, when features of different dimension are present on the same substrate, and etched together simultaneously, wider trenches are etched at faster rates than narrower trenches. In both cases, the etch rate decreases as aspect ratio increases. An example of ARDE is shown in the cross section of FIG. 2. In this case, trenches with widths ranging from 2.5 μm to 100 μm were located adjacent to one another and etched in one process. ARDE lag, sometimes called reactive ion etching (RIE) lag, is measured as trench depths are normalized to that of a 100 μm-wide trench, and the result is given in FIG. 3. In this case, when the 100 μm-wide trench is etched to a depth of 130 μm, a 10 μm-wide trench is only etched to a depth of 94 μm and 2.5 μm-wide trench is only etched to a depth of 62 μm.

The ARDE effect presents challenging complications to MEMS device fabrication. When structures with various lateral dimensions coexist and are etched at once, the resulting vertical dimensions are different, which may be incompatible with device design requirements. Even for a single structure, as etching progresses, the vertical etch rate is not constant, which could represent a process control issue. Indeed, RIE lag is a highly complex phenomenon and many mechanisms are proposed to explain the change in etch rate with increasing aspect ratio. In general, many factors contribute prominently to RIE lag such as: (i) ion flux loss at the bottom of the etched structure; and (ii) reactive neutral species depletions due to neutral shadowing and Knudsen transport.

In practice, MEMS device designers and device makers have to cope with the ARDE effect. One widely used method is to employ an etch stop layer. In silicon-on-insulator (SOI) and silicon-on-glass (SOG) wafers, a buried oxide layer is used to stop etching to compensate for the RIE lag. However, two disadvantages emerge when SOI or SOG wafers are used. The first disadvantage is notching at the silicon/oxide interface which is often undesirable. The second disadvantage is SOI and SOG wafers are more expensive than silicon wafers.

Alternatively, a number of groups have investigated other means to alleviate the ARDE effect. The following is an overview of these investigations.

Doh et al. report improvement of RIE lag at increased bias voltage and increased bias frequency in an electron cyclotron resonance (ECR) plasma etching system. Doh et al. teach etching silicon dioxide ($SiO_2$) with $C_4F_8+H_2$ plasma in an ECR system. The bias voltage is ranged from 100 to 300 volts, and bias frequency from 100 kHz to 1 MHz, and chamber pressure from 3.0 mTorr to 7.5 mTorr. Higher bias frequency and bias voltage result in significant reduction in RIE lag, and decreased pressure also contributes to smaller RIE lag. While Doh et al. teach in great detail the effects of plasma parameters on RIE lag, their technique uses a single step process and does not teach or suggest its use in a TDM process. Furthermore, the results of Doh et al. were achieved in etching silicon dioxide in contrast to the current invention which achieved results in etching silicon.

Lill et al. disclose RIE lag results in an experiment of etching polysilicon with an $SF_6$ plasma in an inductively coupled plasma (ICP) system. Reduced RIE lag is reported at high pressure (up to 20 mTorr) and medium cathode temperature (i.e., 45° C.). While such a result is noteworthy, the polysilicon is etched with a single step process. In contrast, TDM processes utilize alternating deposition and etching schemes.

Tsujimoto et al. teach a method in which gas residence time is reduced to reduce RIE lag. $Cl_2$ plasma is used to etch polysilicon in an ICP system. At lower chamber pressure, RIE lag is observed to decrease. However, the etching process with $Cl_2$ plasma is not a TDM process, and the much slower etch rate and low mask selectivity with $Cl_2$ plasma makes it impractical to etch three-dimensional structures with depths greater than a few tens of micrometers.

Chung et al. (U.S. Patent Application number 2003/0171000) teach ARDE reduction for TDM silicon etch processes through two methods. The first method teaches modifying the pattern geometry to equalize the load between the wide and narrow features. The second method teaches closing the auto pressure control valve to raise the process pressure in both the etch and deposition steps. Chung et al. do not teach increasing the deposition time, decreasing the etch time, increasing the polymer deposition rate, or decreasing the polymer removal rate to correct ARDE. In addition, Chung et al. do not teach or suggest the use of real time feedback on the etch depth difference to correct ARDE during the process.

Rickard et al. (SPIE Conference "Microelectroinic & MEMs Technologies, Edinburgh (UK), May 2001) performed a series of designed experiments to reduce ARDE using a TDM process. During their experiments they found ARDE was minimized through shorter etch times, low pressures, low platen (RF bias) powers, and increased deposition times. Rickard et al. do not disclose a method to measure the extent of lag in the process in real time. Furthermore, Rickard et al. do not disclose the use of closed loop adaptive recipe control to minimize ARDE during the TDM process.

Lill et al. (U.S. Pat. No. 6,632,321) teach the use of interferometry for real time etch rate control. The interferometer used by Lill et al. is based on an ultra-violet (UV) light source while the current invention uses a laser source. Lill et al. teach the use of a single beam to monitor the cyclical change in intensity to determine the etch rate. Whereas, the current inventors employ multiple beams to directly measure the interference as a phase difference between beams to determine the difference in their etch depth which measures the etch rate. Lill et al. teach light reflection from the surface for monitoring the etch rate, but do not teach direct measurement of at least two different feature widths for real time etch depth control. In addition, Lill et al. teach the control method to maintain a constant etch rate while the current invention does not monitor etch rate, but rather controls the process to control the etch depth difference between at least two different size features. Furthermore, Lill et al. do not contemplate applying real time control to a time division multiplex process. As a result Lill et al. do not teach the reduction of etch step time, increased polymer deposition time, reduced polymer removal rate or increased polymer deposition rate as solutions to ARDE in TDM silicon etch processes.

Ayon et al. (Journal of Electrochem. Soc., 146(1) 339-349 (1999)) teach the minimization of ARDE for TDM processes through the use of high (140 sccm) $SF_6$ flow rates. Ayon et al. report that in the regime where ARDE was minimized that the floor of the feature profiles varied from convex to concave across the feature dimensions. This effect is undesirable. Ayon et al. do not contemplate real time measurement and control of the process to minimize ARDE.

Laermer et al. (U.S. Pat. No. 6,720,268) teach the use of optical emission spectroscopy during the process to determine when the polymer clears during a TDM process. Laermer et al. do not teach the use of a twin beam interferometer for real-time process feedback. In addition, Laermer et al. do not teach the use of real time measurement of two features simultaneously to reduce ARDE.

Hopkins et al. (U.S. Pat. No. 6,187,685) discuss the mechanisms that lead to ARDE in TDM processes. Specifically, the mechanisms are as follows: more deposition present in wide trenches as compared to narrow trenches (presumably due to transport limitations), resulting in more polymer to be removed in the wider (lower aspect ratio) feature than in narrow features, and that the silicon etch rate is higher in wider (lower aspect ratio) features, so that the net effect of the etch and passivation (removal and deposition) is to equalize the etch rates of the narrow and wide features. Hopkins et al. teach that the RIE lag compensation effect can be achieved through a number of ways which allow judicious balance of the etch and deposition conditions to achieve the same effect. Hopkins et al. teach that pulsed RF bias also exhibits ARDE reduction in TDM silicon etch processes. Hopkins et al. do not contemplate the use of real time metrology to monitor or modify the process.

Therefore, there is a need for reducing the ARDE effect in TDM processes.

Nothing in the prior art provides the benefits attendant with the present invention.

Therefore, it is an object of the present invention to provide an improvement which overcomes the inadequacies of the prior art devices and which is a significant contribution to the advancement of the semiconductor processing art.

Another object of the present invention is to provide a method for reducing aspect ratio dependent etching in a plasma etching process, the method comprising: placing a substrate in a vacuum chamber; depositing a passivation layer on said substrate by means of a plasma; removing at least a portion of said passivation layer by means of a plasma; etching a material from said substrate by means of a plasma; performing a process loop of repeating the deposition step, the removal step, and the etch step; monitoring different sized features on said substrate over time; controlling the process loop step based on said monitoring step; and removing the substrate from the vacuum chamber.

Yet another object of the present invention is to provide a method for reducing aspect ratio dependent etching in a plasma etching process, the method comprising: placing a substrate in a vacuum chamber; depositing a polymer on said substrate by means of a plasma; removing at least a portion of said polymer by means of a plasma; etching a material from said substrate by means of a plasma; performing a process loop of repeating the deposition step, the removal step, and the etch step; adjusting a process parameter in at least one step to achieve equivalent etch depths of at least two different sized features; and removing the substrate from the vacuum chamber.

Still yet another object of the present invention is to provide an apparatus for reducing aspect ratio dependent etching during plasma etching of a substrate comprising: a vacuum chamber; at least one gas supply source for supplying at least one process gas into said vacuum chamber; an exhaust in communication with said vacuum chamber; a lower electrode positioned within said vacuum chamber; a substrate holder connected to said lower electrode; a plasma source for generating a plasma within said vacuum chamber; a process controller for alternately depositing a passivation layer on the substrate by means of a plasma, removing at least a portion of the deposited passivation layer by means of a plasma, and etching a material from the substrate by means of a plasma; and a differential interferometer coupled to said process controller, said differential interferometer generating a signal indicative of a difference in depth between at least two different size features, and said process controller varying at least one process parameter in response to the signal generated by said differential interferometer.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

For the purpose of summarizing this invention, this invention comprises an improved method and an apparatus for deep silicon trench etching using an alternating cyclical etch process or time division multiplexed (TDM) process to reduce aspect ratio dependent etching (ARDE).

More specifically, the present invention provides the use of a real time metrology device (e.g., twin spot interferometric camera) to monitor the etch of two different size features over time, calculate etch depth difference signal, feed the signal back to a process controller, and adjust the process to minimize differences in etch depth between the monitored features, thereby, reducing ARDE during a TDM process.

A feature of the present invention is to provide a method for reducing aspect ratio dependent etching in a plasma etching process. The method comprising the placing of a substrate in a vacuum chamber. The substrate can be a semiconductor substrate such as Silicon, Gallium Arsenide or any known semiconductor, including compound semiconductors e.g., Group II and Group VI compounds and Group III and Group V compounds. The substrate may also be a conductor or a dielectric material such as glass or quartz. During a deposition step, a passivation layer is deposited on the substrate by means of a plasma. A first plasma is generated in the vacuum chamber from a first process gas, such as octofluorocyclobutane, to deposit a passivation layer on the substrate. The passivation layer consists of a polymer or a fluorocarbon polymer, or can be silicon, carbon, nitride or any other known passivating materials that can be deposited via a plasma. During a removal step, at least a portion of the passivation layer is removed by means of a plasma. A second plasma is generated in the vacuum chamber from a second process gas, such as a mixture of sulfur hexafluoride, argon and oxygen, to remove the passivation layer from the substrate. During an etch step, a material, such as silicon, is etched from the substrate by means of a plasma. A third plasma is generated in the vacuum chamber from a third process gas, such as sulfur hexafluoride, to etch a material from the substrate. A process loop is performed that repeats the deposition step, the removal step, and the etch step. Different sized features on the substrate are monitored in real time. The process loop step is controlled based on the monitoring step to reduce ARDE. Finally, upon completion of the etch process, the substrate is removed from the vacuum chamber.

Another feature of the present invention is to provide a method for reducing aspect ratio dependent etching in a plasma etching process. The method comprising the placing of a substrate in a vacuum chamber. The substrate can be a semiconductor substrate such as Silicon, Gallium Arsenide or any known semiconductor, including compound semiconductors e.g., Group II and Group VI compounds and Group III and Group V compounds. The substrate may also be a conductor or a dielectric material such as glass or quartz. During a deposition step, a passivation layer is deposited on the substrate by means of a plasma. A first plasma is generated in the vacuum chamber from a first process gas, such as octofluorocyclobutane sulfur, to deposit a passivation layer on the substrate. The passivation layer consists of a polymer or a fluorocarbon polymer, or can be silicon, carbon, nitride or any other known passivating materials that can be deposited via a plasma. During a removal step, at least a portion of the passivation layer is removed by means of a plasma. A second plasma is generated in the vacuum chamber from a second process gas, such as a mixture of sulfur hexafluoride, argon and oxygen, to remove the passivation layer from the substrate. During an etch step, a material, such as silicon, is etched from the substrate by means of a plasma. A third plasma is generated in the vacuum chamber from a third process gas, such as sulfur hexafluoride, to etch a material from the substrate. A process parameter such as the deposition time period, removal time period and etch time period are adjusted to quantify the process etch, polymer removal and deposition rates as a function of aspect ratio. The process parameter can be further defined as the rate of deposition of the polymer which can be controlled through an RF power supplied to a deposition gas in the chamber, a flow rate of the deposition gas flowing into the chamber, or a pressure of the deposition gas in the chamber. Alternatively, the process parameter can be further defined as the rate of removal of the polymer which can be controlled through an RF power supplied to a removal gas in the chamber, a flow rate of the removal gas flowing into the chamber, or a pressure of the removal gas in the chamber. Alternatively, the process parameter can be further defined as the rate of etching the material which can be controlled through an RF power supplied to an etching gas in the chamber, a flow rate of the etching gas flowing into the chamber, or a pressure of the etching gas in the chamber. A process loop is performed that repeats the deposition step, the removal step, and the etch step. Finally, upon completion of the etch process, the substrate is removed from the vacuum chamber.

Still yet another feature of the present invention is to provide an apparatus for reducing aspect ratio dependent etching during plasma etching of a substrate. The substrate can be a semiconductor substrate such as Silicon, Gallium Arsenide or any known semiconductor, including compound semiconductors e.g., Group II and Group VI compounds and Group III and Group V compounds. The substrate may also be a conductor or a dielectric material such as glass or quartz. The apparatus comprising a vacuum chamber having at least one gas supply source for supplying at least one process gas into the vacuum chamber and an exhaust in communication with the vacuum chamber. The process gas is selected based on the associated process, i.e., deposition of a polymer (octofluorocyclobutane), removal of the polymer (mixture of sulfur hexafluoride, argon and oxygen), or etching of a material (sulfur hexafluoride) from the substrate. The material etched from the substrate is usually silicon. A lower electrode is positioned within the vacuum chamber for applying a bias to the substrate that is placed upon a substrate holder that is connected to the lower electrode. The bias can be powered by RF or DC power. A plasma source generates a plasma within the vacuum chamber. The plasma that is generated is controlled through a process controller for alternately depositing a passivation layer on the substrate by means of a first plasma, removing at least a portion of the deposited passivation layer by means of a second plasma, and etching a material from the substrate by means of a third plasma. A differential interferometer is coupled to the process controller. The differential interferometer generates a laser light beam onto the substrate and measures the difference in depth between at least two different size features on the substrate in real time so that the process can be adjusted through the process controller coupled to the differential interferometer. The process controller varies at least one process parameter in response to the signal generated by the differential interferometer, thereby, reducing ARDE during a TDM process.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

FIG. 1 is a pictorial overview of a TDM etch process for deep silicon etching;

FIG. 13 is a scanning electron microscopy photograph of an etch performed using a TDM process for deep silicon etching showing ARDE minimization through the adjustment of the sub-step etch time;

Similar reference characters refer to similar parts throughout the several views of the drawings.

DETAILED DESCRIPTION OF THE INVENTION

We disclose an improved method and apparatus for reducing, or eliminating, RIE lag (ARDE) in TDM etch processes by adjusting the polymer deposition, the removal of the polymer and/or the etching of the material from the substrate.

We also disclose the use of a real time metrology device, differential interferometer, for generating a signal indicative of a difference in depth between at least two different size features to reduce, or eliminate, RIE lag (ARDE) in TDM etch processes.

RIE Lag Reduction Examples

As made apparent in FIG. 1, one needs to start with the three fundamental physical processes (polymer deposition, polymer removal and isotropic silicon etching) in order to reduce or eliminate RIE lag. The etch and deposition characteristics of all three sub-processes are feature size (aspect ratio) dependent. The feature size dependency however is different for each of the three sub-processes.

Figure 4:
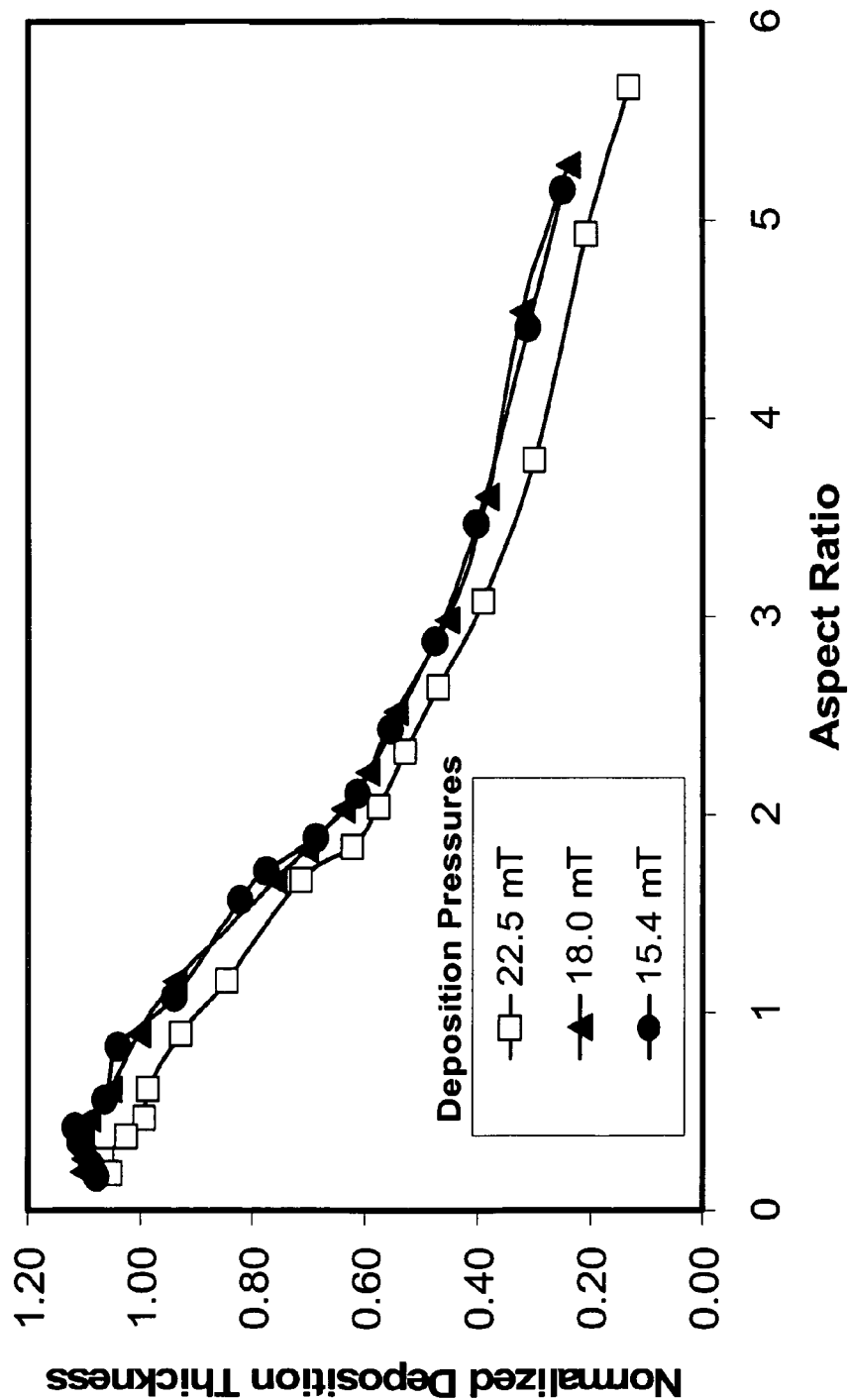
FIG. 4 is a graph of the polymer deposition rate versus feature aspect ratio using a TDM process.

In a typical TDM silicon etch process, the polymer deposition step uses $C_4F_8$ as a gas precursor. The deposition process can be performed with or without the presence of an RF bias. In the case with no RF bias, there is minimal ion bombardment of the substrate. FIG. 4 shows experimental measurements of the polymer deposition rate as a function of feature aspect ratio. Over the range of pressures tested, the deposition rate measured at the bottom of the trench decreased with increasing aspect ratio (e.g., narrower features receive less deposition than wider features of the same depth for a fixed deposition time).

Figure 5:
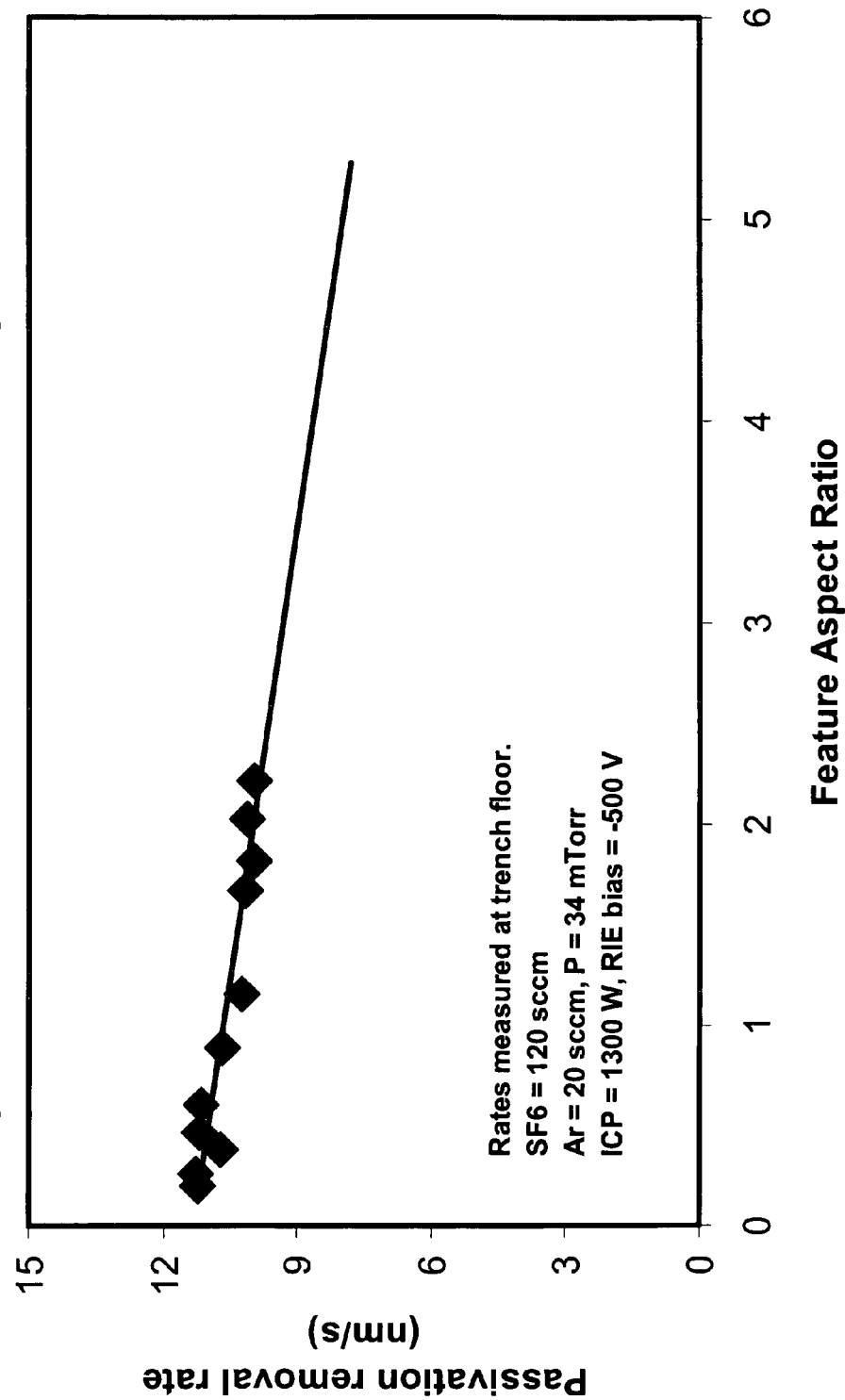
FIG. 5 is a graph of the polymer removal rate versus feature aspect ratio using a TDM process.

In contrast to the polymer deposition process, an $Ar/SF_6$ based polymer removal process is in part ion driven. Whereas, the addition of $O_2$ during the polymer removal step will drive the process toward an ion assisted chemical mechanism. FIG. 5 shows experimental data on polymer removal rate at the trench bottom over a range of aspect ratios. As demonstrated by the measurement results, passivation removal rate is weakly aspect ratio dependent under the process conditions with the passivation removal being slightly faster in the lower aspect ratio features.

Figure 6:
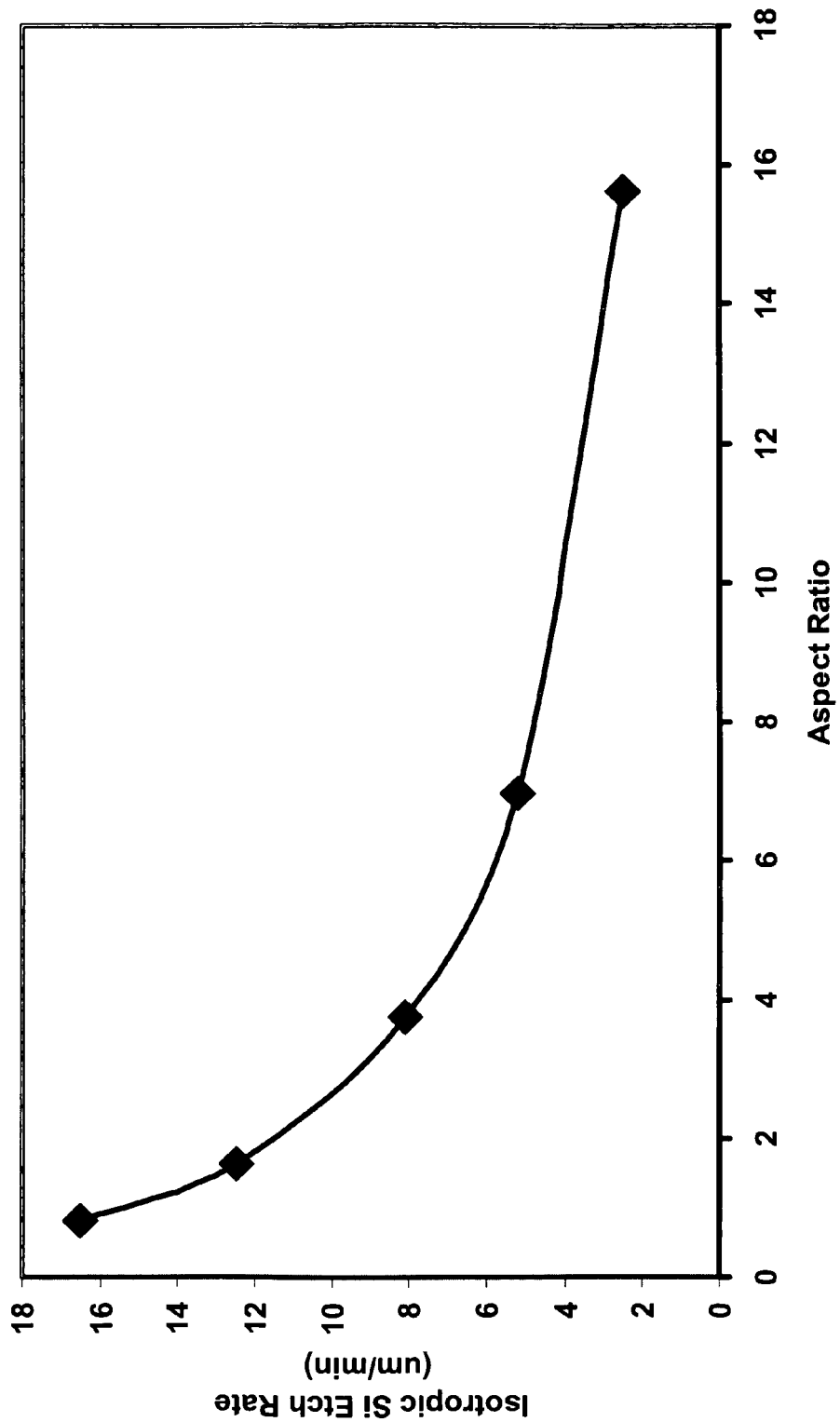
FIG. 6 is a graph of the isotropic silicon etch rate versus feature aspect ratio using a TDM process.

The isotropic silicon etch process is more chemical in nature (not ion driven). Typically in a TDM silicon etch process, the RF bias during the etch sub-process is set to the lowest value that achieves acceptable feature profiles in an effort to maximize the mask to silicon etch selectivity. FIG. 6 shows the isotropic silicon etch rate as a function of aspect ratio. The isotropic silicon etch rate is a strong function of aspect ratio, with the smaller aspect ratios having significantly higher etch rates.

In order to better understand the interrelationship between the three sub-processes and ARDE, a simple model was constructed where:

| | |
|---|---|
| $P(x)$ | Polymer thickness deposited in deposition sub-process |
| $S(x)$ | Silicon etch depth per TDM cycle |
| $R_{comp}(x)$ | Rate of Si etch for composite TDM cycle Si in feature x |
| $R_{dep}(x)$ | Rate of polymer deposition in feature x |
| $R_{poly}(x)$ | Rate of polymer removal in feature x |
| $R_{iso}(x)$ | Rate of Isotropic Si etch in feature x |
| $t_{dep}$ | Deposition time (set in process recipe) |
| $t_{etch}$ | Etch time (set in process recipe) |
| $t_{poly\ etch}(x)$ | Time to remove polymer passivation |
| $t_{iso}(x)$ | Actual Isotropic Si etch time in feature x |

Using the above terms we can calculate the following:

$$\text{Silicon etched in a cycle } S(x) = R_{iso}(x) * t_{iso}(x)$$

$$\text{Polymer thickness } P(x) = R_{dep}(x) * t_{dep}$$

$$\text{Polymer removal time } t_{poly\ etch}(x) = P(x)/R_{poly}(x)$$

$$= R_{dep}(x) * t_{dep}/R_{poly}(x)$$

$$\text{Isotropic silicon etch time } t_{iso}(x) = t_{etch} - t_{poly\ etch}(x)$$

$$= t_{etch} - (R_{dep}(x) * t_{dep}/R_{poly}(x))$$

therefore $$S(x) = R_{iso}(x) * (t_{etch} - (R_{dep}(x) * t_{dep}/R_{poly}(x)))$$

Based on the above equation, the composite silicon etch rate in one TDM cycle is a function of the isotropic silicon etch rate, the polymer deposition time, the polymer removal rate, the etch time, and the deposition time.

In order to examine ARDE in a TDM silicon etch process, consider the composite silicon etch rate for two different size features.

$$S(1) = R_{iso}(1) * (t_{etch} - (R_{dep}(1) * t_{dep}/R_{poly}(1)))$$

$$S(2) = R_{iso}(2) * (t_{etch} - (R_{dep}(2) * t_{dep}/R_{poly}(2)))$$

For the case where there is no ARDE, $S(x)$ should be the same for different feature widths.

$$S(1) = S(2)$$

The polymer removal rate is nearly independent of feature size, consequently we can use the approximation that:

$$R_{poly}(1) \sim R_{poly}(2) = R_{poly}$$

Performing the substitution and rearranging the terms yields:

$$t_{etch} = t_{dep} * (R_{iso}(1) * R_{dep}(1) - R_{iso}(2) * R(2))/(R_{poly} * (R_{iso}(1) - R_{iso}(2))$$

The above equation relates the recipe specified etch time and recipe specified deposition time as a function of the isotropic silicon etch rate, deposition rate, and polymer removal rate. RIE lag in a TDM process can be reduced by quantifying the process etch, polymer removal and deposition rates as a function of aspect ratio, and choosing the appropriate recipe times.

Conversely, for specified recipe times, the process steps can be adjusted such that the behavior of the process etch, polymer removal and deposition rates as a function of aspect ratio result in minimal ARDE.

Figure 7:
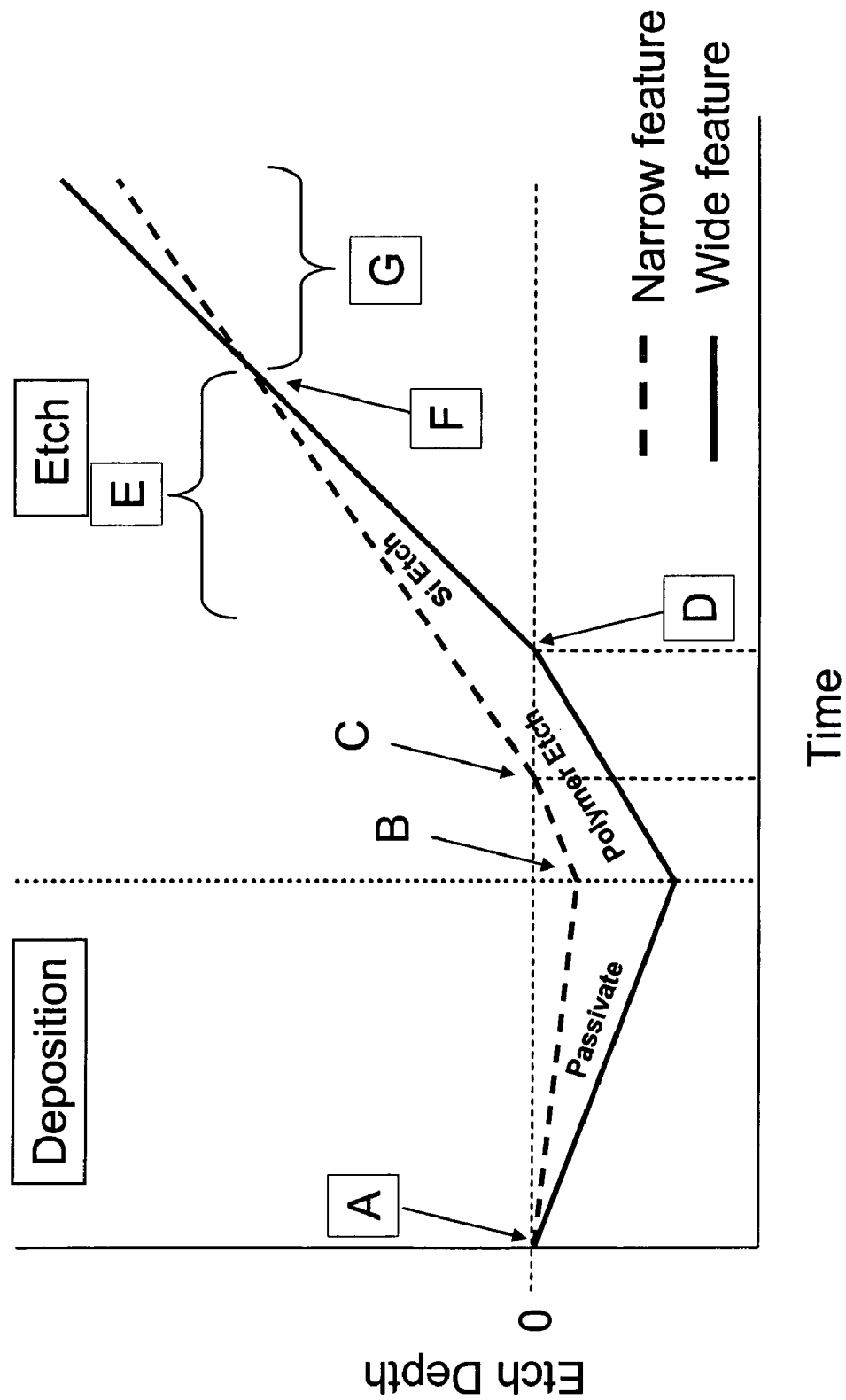
FIG. 7 is a graph of etch depth versus time for one TDM cycle.
Figure 8:
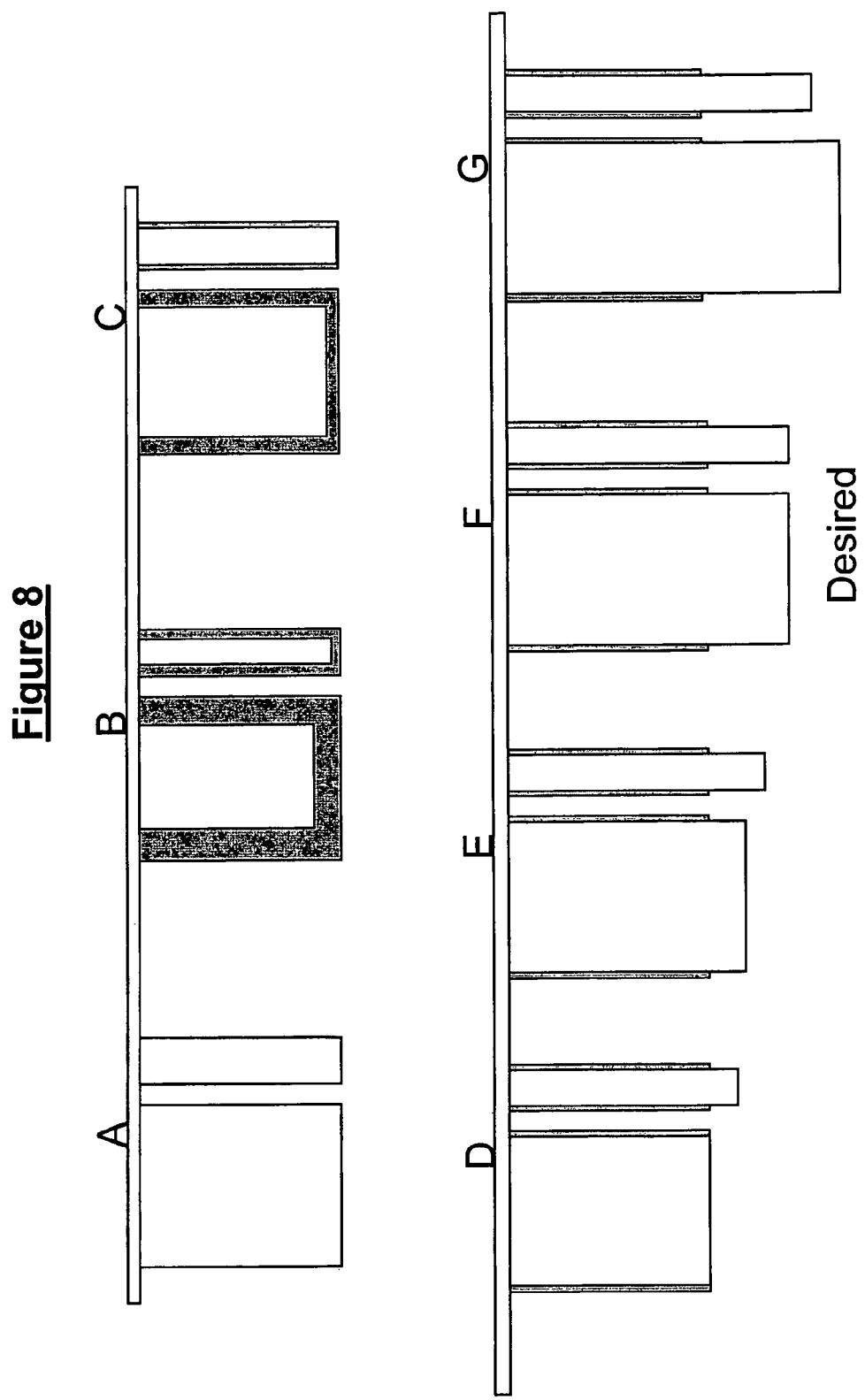
FIG. 8 is a graph of etch depth versus time for one TDM cycle.

FIGS. 7 & 8 show the etch depth of two features of different widths during one TDM cycle. At point "A", both features start at the same depth. By the end of the deposition step, point "B", the deposited polymer film in the wider features is thicker than the narrower features due to the higher polymer deposition rate in lower aspect ratio features (FIG. 4). The first portion of the etch step serves to remove the polymer before isotropic silicon etching can occur. Since the polymer removal rate is nearly independent of aspect ratio (FIG. 5) and the small features start with a thinner polymer layer, the narrow features will clear the polymer film first (point "C"). This allows the silicon etch to proceed in the narrow features while the remaining polymer in the wider features continues to clear. By the time the wider features have cleared (point "D"), the narrow features have etched some depth into the silicon. (Essentially the narrow features get a "head start" etching the silicon while the additional polymer clears from the wider features). Once the polymer has cleared from the wider features, they begin to etch at a higher rate than the narrow features (FIG. 6). During segment "E" both the wide and narrow features etch further into the silicon. The narrow features are deeper due to the increased isotropic etch time, but the wider features are etching at a faster rate. At point "F", the wide and narrow features have reached the same depth—stopping the etch at this time will result in a process without ARDE. As the etch is allowed to proceed past point "F" the wider features continue to etch faster than the smaller features resulting in the typical ARDE process.

Based on the model, for features that start at the same depth, it is possible to achieve a zero ARDE TDM process by ensuring that the TDM cycle terminates at point "F." If the features start at different depths, it is possible to adjust the TDM process to compensate for the different start depths to achieve zero lag as the etch proceeds. This compensation may take one or more TDM cycles to accomplish.

For a set TDM recipe, there are four ways to adjust the process to achieve a zero ARDE process:
  Adjust the recipe etch time
  Adjust the polymer removal rate
  Adjust the recipe deposition time
  Adjust the polymer deposition rate The process shown schematically in FIG. 7 (baseline process) would exhibit ARDE.

Figure 9:
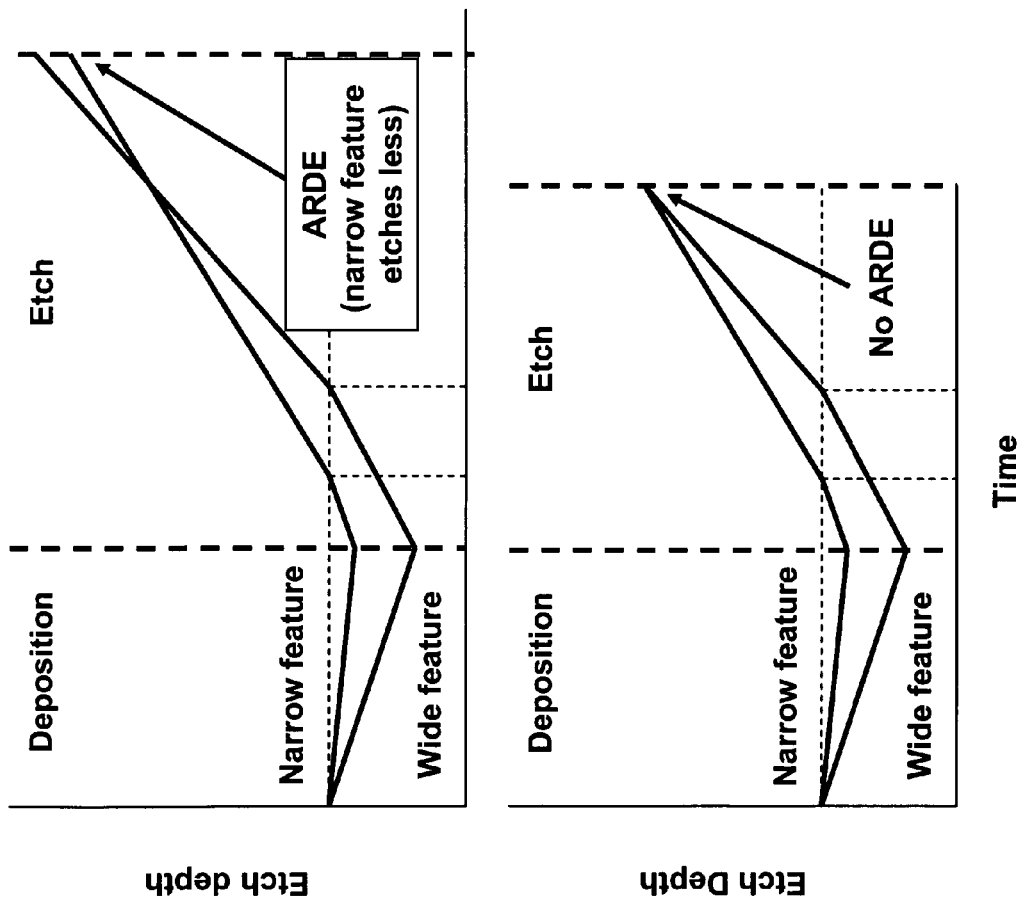
FIG. 9 is a graph of etch depth versus time for a TDM process where the etch time is decreased such that the narrow and wide features have the same etch depth thereby eliminating ARDE.

FIG. 9 shows a modification of the baseline process where the etch time is decreased such that the narrow and wide features have the same etch depth thereby eliminating ARDE.

Figure 10:
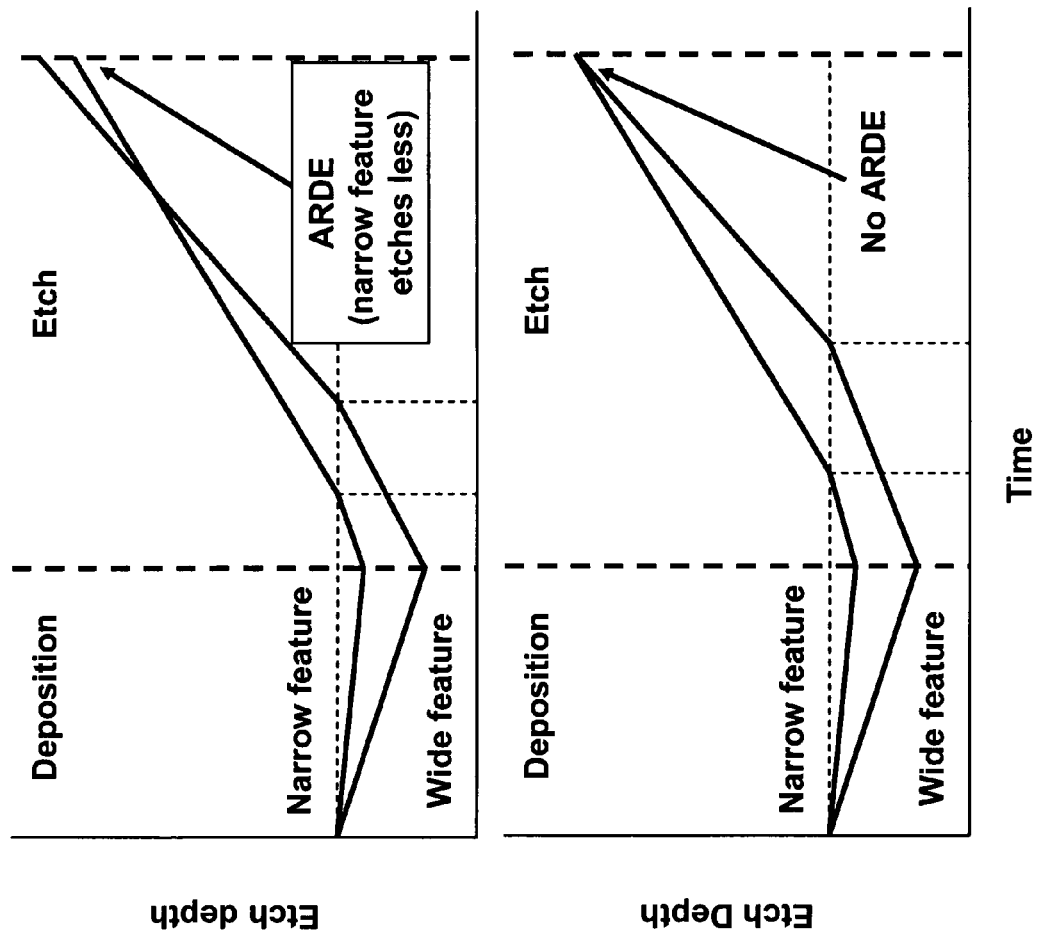
FIG. 10 is a graph of etch depth versus time for a TDM process where the polymer etch rate is decreased such that the narrow and wide features have the same etch depth thereby eliminating ARDE.

FIG. 10 shows a modification of the baseline process such that the polymer removal time has been increased (polymer removal rate has been decreased). This can be accomplished through changes to the deposition process sub-step to make the polymer more resistant to the etch chemistry, or modifications to the etch step to make it less efficient in removing the polymer. The process changes in the deposition and/or etch sub-step can include changes in gas flow, gas composition, process pressure, or applied RF power (to either the substrate support or high density source). Alternatively, the etch step can be broken into multiple sub-steps with one of the sub-steps (preferably the $1^{st}$ etch sub-step) optimized to achieve the polymer removal rate that results in zero ARDE.

Figure 11:
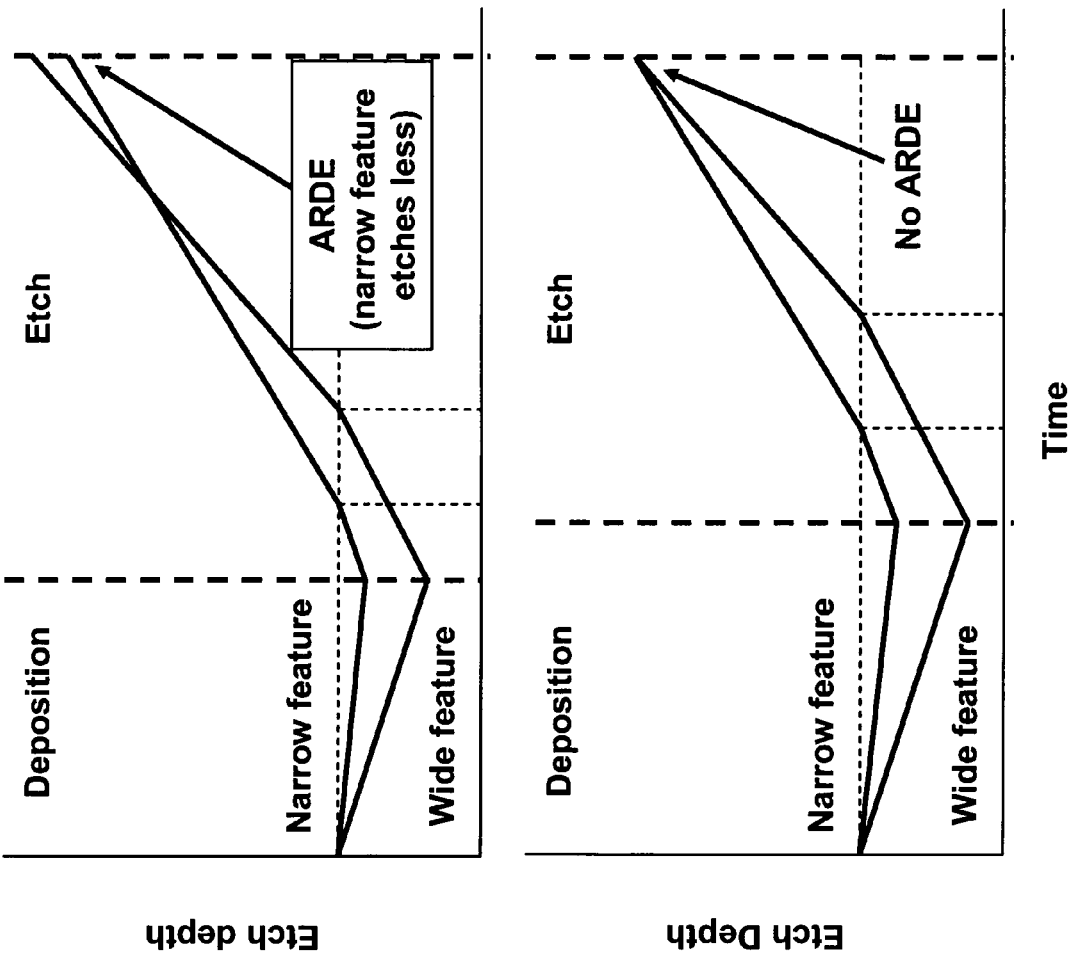
FIG. 11 is a graph of etch depth versus time for a TDM process where the deposition time is increased such that the narrow and wide features have the same etch depth thereby eliminating ARDE.

FIG. 11 shows a modification of the baseline process such that the deposition time has been increased. Increasing the deposition time increases the thickness of the polymer deposited in the features. Increasing the thickness of the deposited polymer will increase the polymer removal time for a given etch process.

Figure 12:
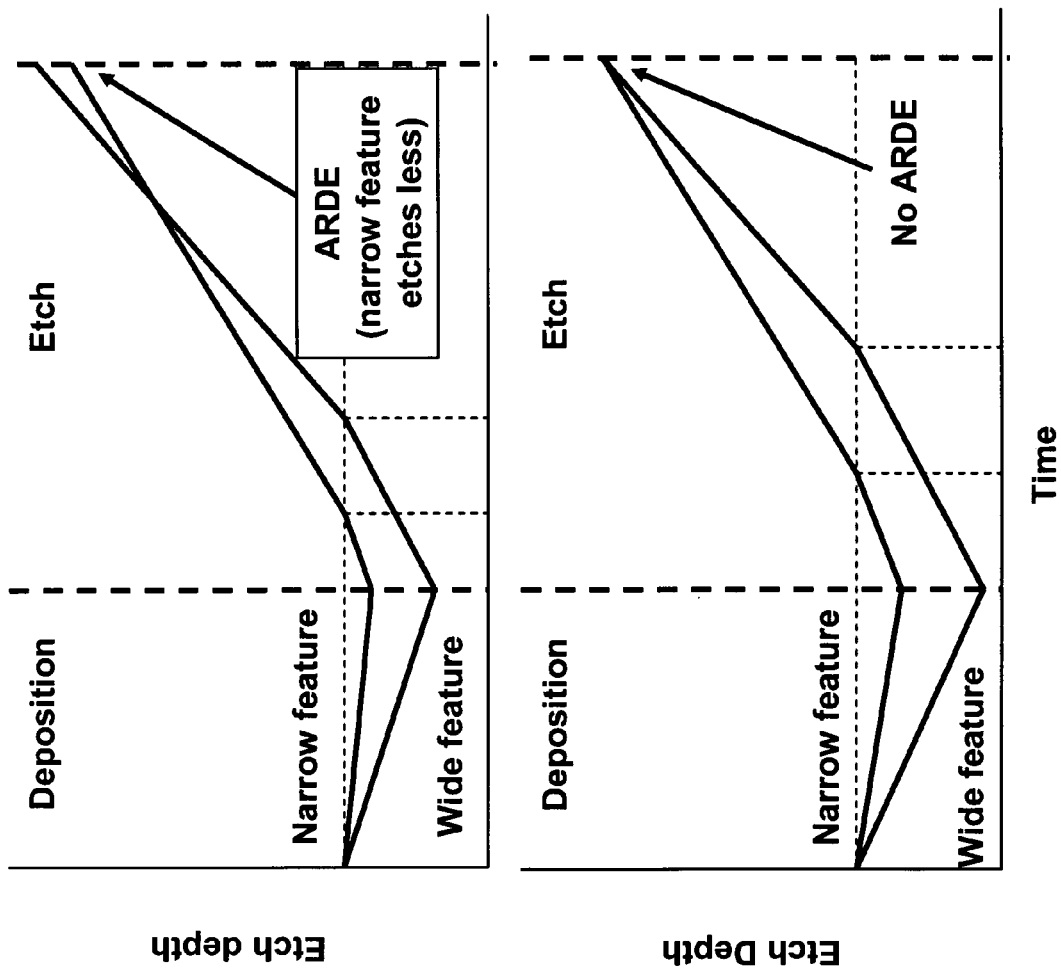
FIG. 12 is a graph of etch depth versus time for a TDM process where the deposition rate is increased such that the narrow and wide features have the same etch depth thereby eliminating ARDE.

FIG. 12 shows a modification of the baseline process such that the polymer deposition rate has been increased. Increasing the thickness of the deposited polymer will increase the polymer removal time for a given etch process. The deposition rate increase can be accomplished by changing one or more process variables in the deposition sub-step. These adjustments can include changes in gas flow, gas composition, process pressure, or applied RF power. Typically the deposition rate increases with increased high density power, increased process pressure and increased gas glow.

While the baseline process as shown results in ARDE, it is possible to have a baseline process that shows inverse ARDE (smaller features etching faster). The four methods described above can also be used to adjust the baseline process to reduce inverse ARDE using a similar method.

Figure 3:
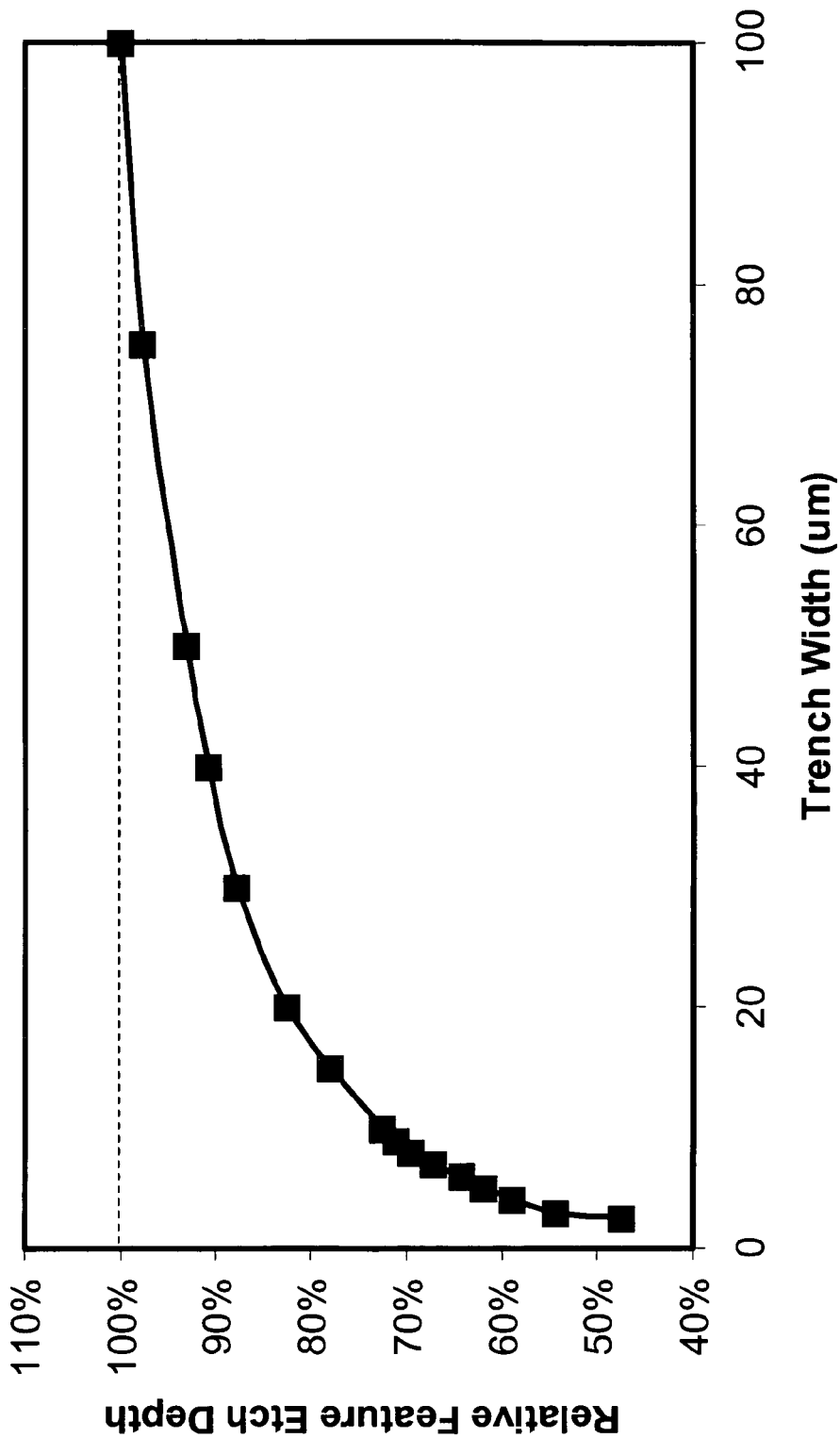
FIG. 3 is a graph of feature etch depth versus feature width of ARDE using the prior art TDM process.
Figure 14:
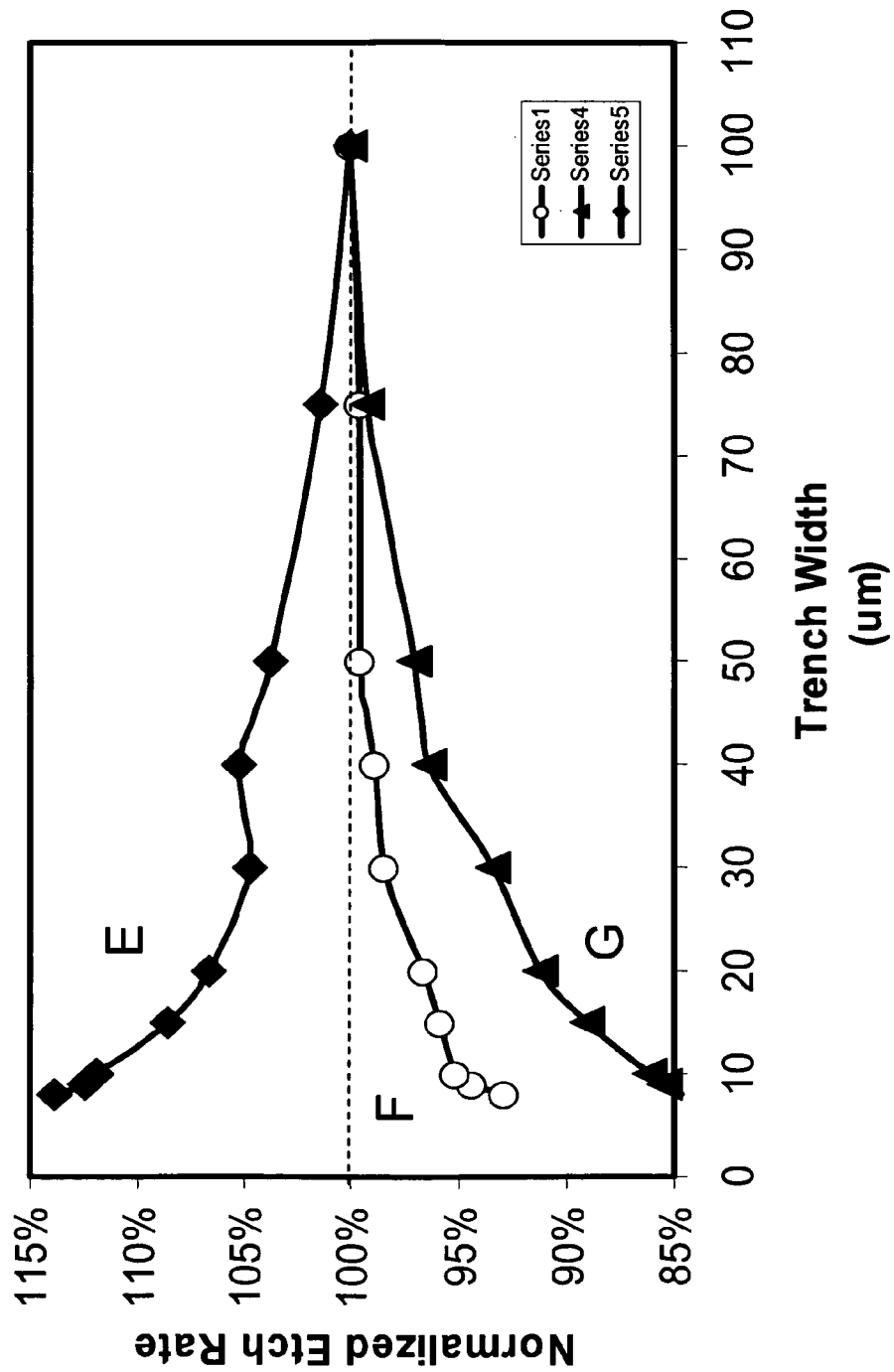
FIG. 14 is a graph of etch rate versus feature width showing ARDE control by changes in etch time for a TDM process.

FIG. 13 shows ARDE minimization through the adjustment of the sub-step etch time. SEM cross section "E" corresponds to a point in range "E" in FIG. 7. As the model predicts the TDM etch process shows inverse ARDE with the narrow features etching faster than the wider features. FIG. 13 SEM cross section "F" corresponds to a process near point "F" in FIG. 7. The measurements of the feature depth vs. trench width in FIG. 14 (series F) show that the ARDE has been reduced to less than 5% for trenches with widths in the range of 10 μm to 100 μm. This compares with the prior art process (FIG. 3) with shows an ARDE of 30% for trenches in the range of 10 μm to 100 μm wide. FIG. 13 SEM cross section "G" corresponds to a point in the range "G" in FIG. 7. In this case the wider features etch faster than the narrow features (typical ARDE).

Figure 15:
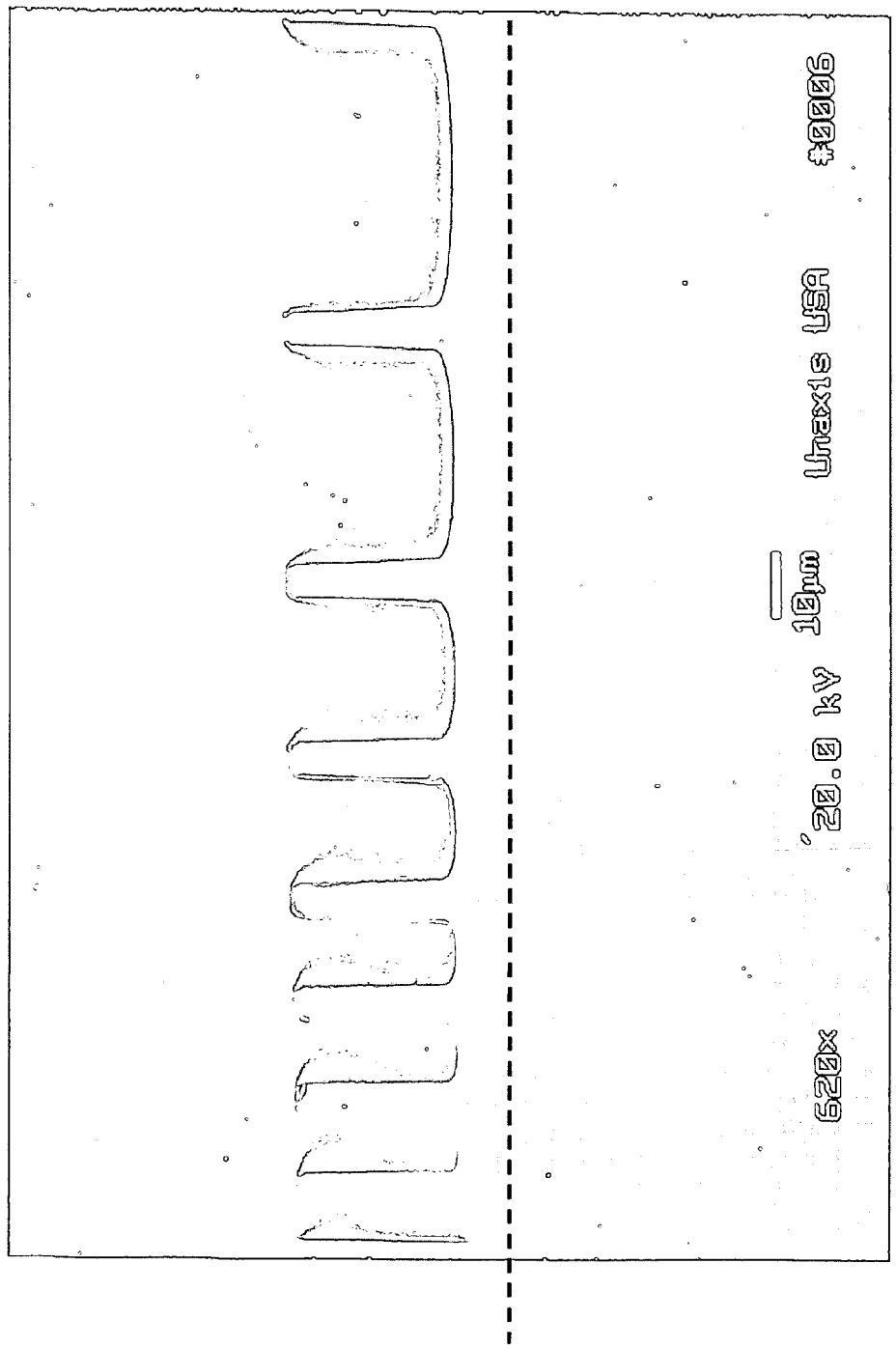
FIG. 15 is a scanning electron microscopy photograph of an etch performed using a TDM process for deep silicon etching showing ARDE minimization through the adjustment of the etch sub-step time.
Figure 16:
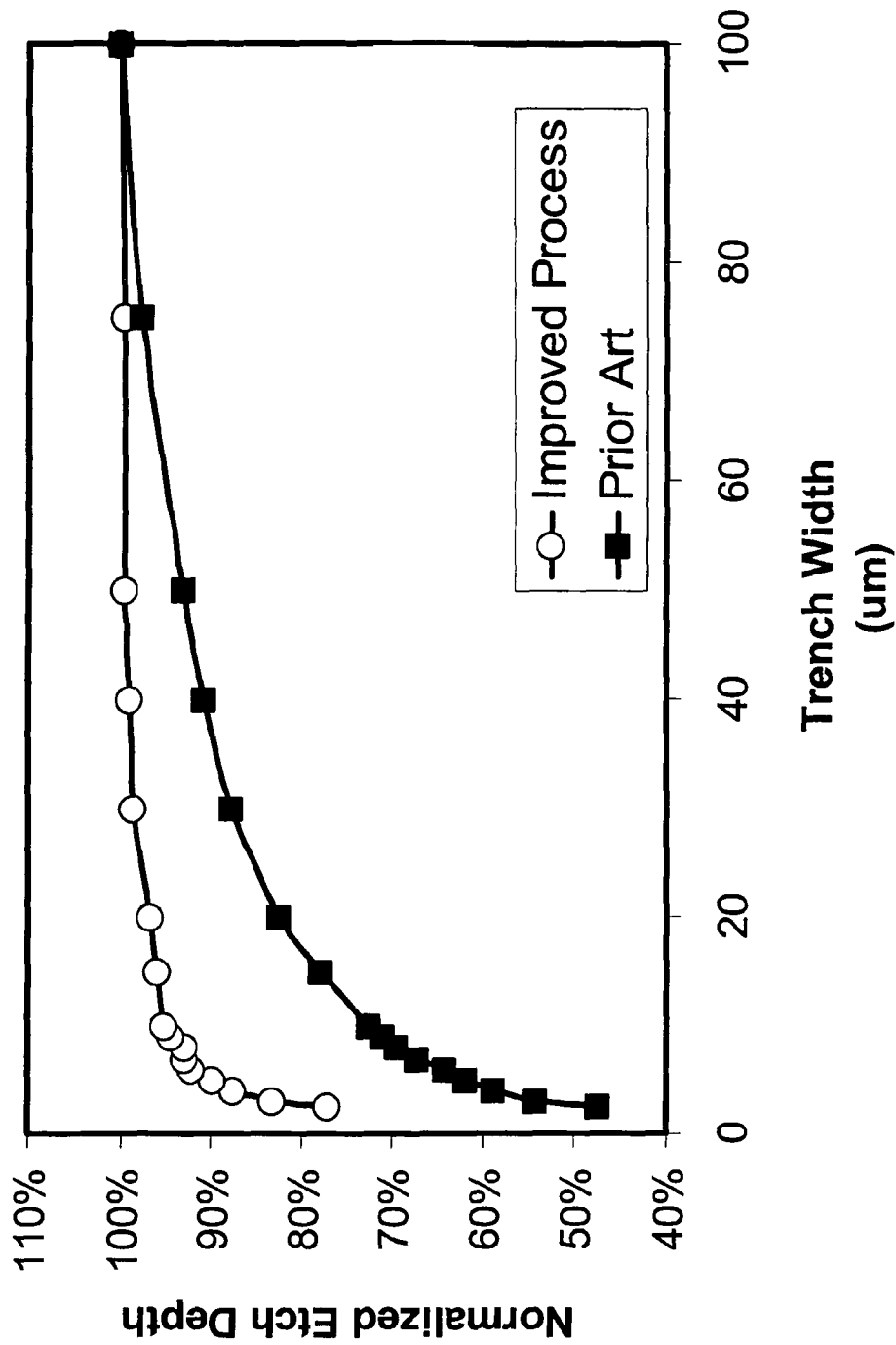
FIG. 16 is a graph of etch rate versus feature size showing ARDE control by changes in etch time for a TDM process.

FIG. 15 shows a SEM cross section of features ranging from 5 μm to 40 μm wide using the method of adjusting the etch sub-step time to minimize ARDE. FIG. 16 shows a plot of the etch depth vs. feature size from SEM cross section measurements from FIG. 15.

ARDE over the range of 5 μm to 100 μm features has been reduced from 38% to 10%. Over the range of 2.5 μm to 100 μm features the ARDE has been reduced from 53% to 23%.

In another embodiment of the current invention an interferometer is used to measure the difference in etch depth between at least two different size features during the TDM process. In order to monitor the etch depth difference between two different size features, it is instructive to look at the behavior of the etch depth difference during the course of the TDM process.

Figure 2:
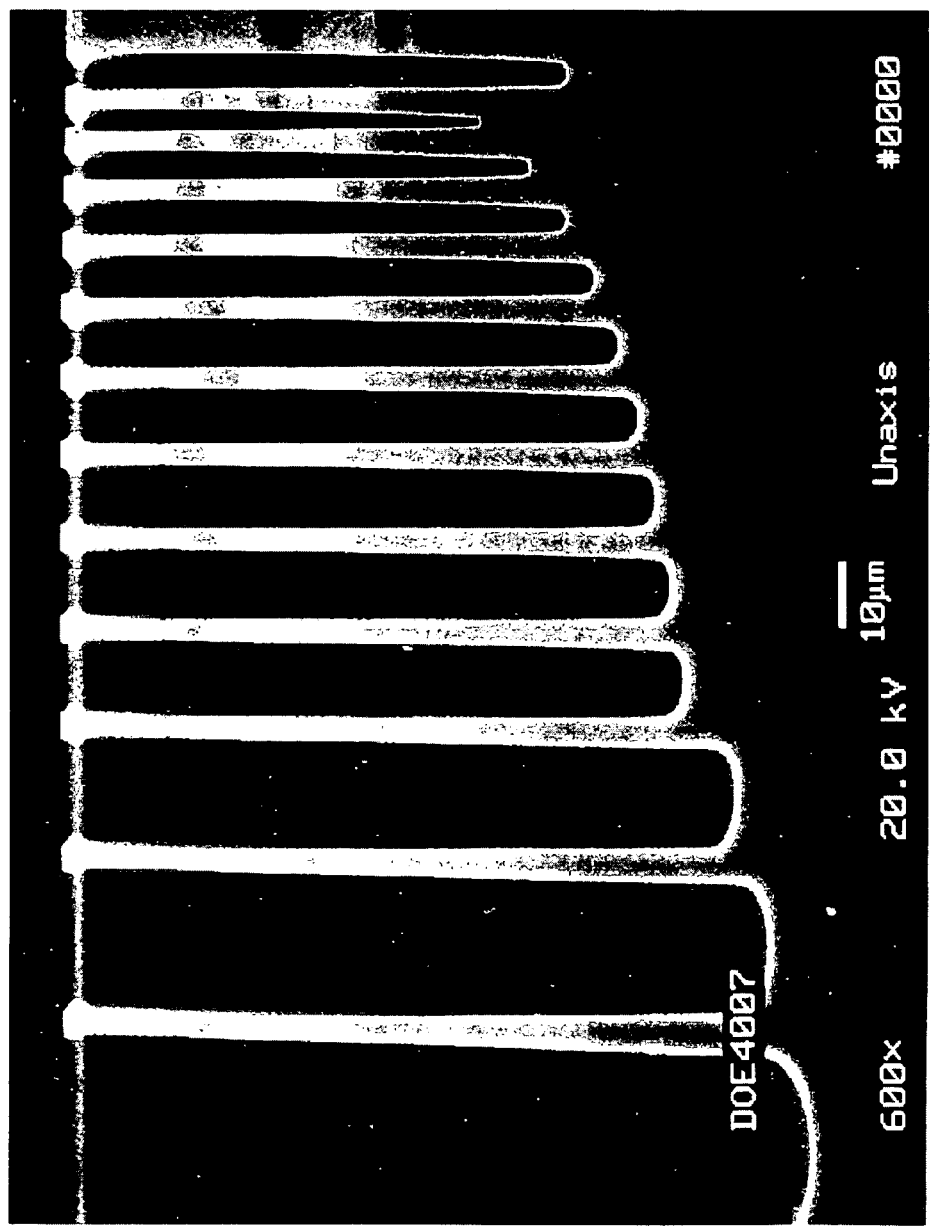
FIG. 2 is a scanning electron microscopy (SEM) photograph of an etch performed using a TDM process for deep silicon etching showing the prior art ARDE profile.
Figure 17:
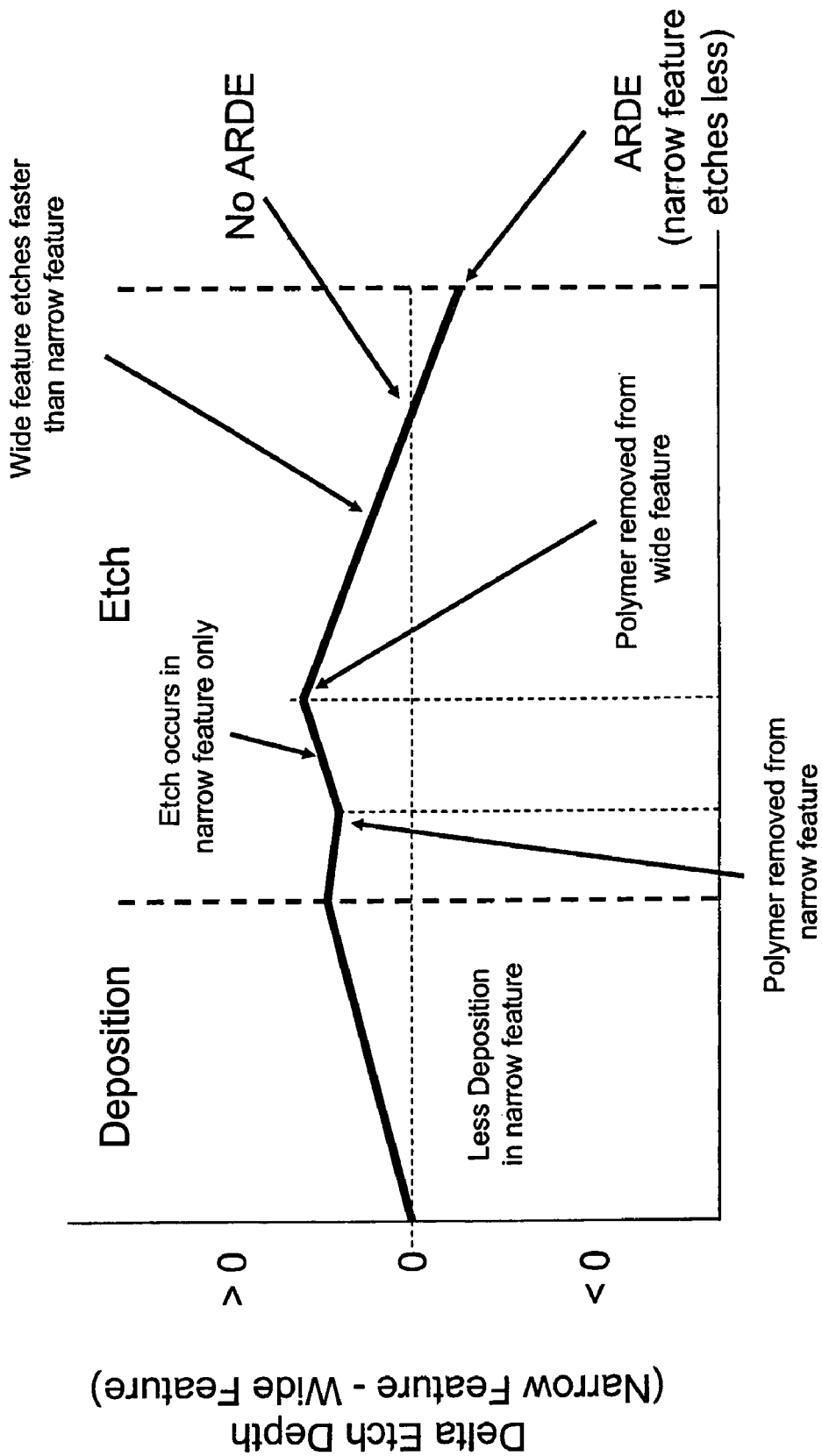
FIG. 17 is a graphical depiction of the etch depth difference between a narrow feature and a wide feature during the course of one TDM cycle.

FIG. 17 shows the etch depth difference between a narrow feature and a wide feature during the course of one TDM cycle. The graph depicts two features that start at the same depth (initial etch depth delta at zero). During the deposition sub-step(s) of the cycle, the etch depth difference between the narrow and wide features is greater than zero (wider features have a higher deposition rate). Once the etch sub-step(s) is started, the etch delta will develop a small negative slope with a value greater than zero. This reflects the polymer removal in both wide and narrow features (though slightly faster in the wider features). Once the polymer clears in the narrow features (due to the fact that they received a thinner film during deposition), the silicon will begin to etch in the narrow features (wider features still passivated with polymer). During this phase (narrow features etching silicon, wider features still clearing polymer) the slope of the etch depth difference becomes greater than zero while the value of the etch depth difference remains greater than zero. Once the wider features clear the polymer passivation layer and begin to etch, the slope of the etch depth difference once again becomes negative (wider features having a higher isotropic silicon etch rate than narrow features). Initially when the polymer is cleared and both features begin to etch, the value of the etch depth difference is still greater than zero (small features are deeper—inverse ARDE). At some point in time during the remainder of the etch step(s), the depth of the wider features will catch up and equal the narrow features (minimal ARDE). If the etch step(s) are allowed to proceed past this time, the wider features will continue to etch faster (negative etch difference slope) and the etch depth difference will become negative (wider features deeper than narrow features). At this point, the process will yield the prior art ARDE profile (FIG. 2).

Figure 18:
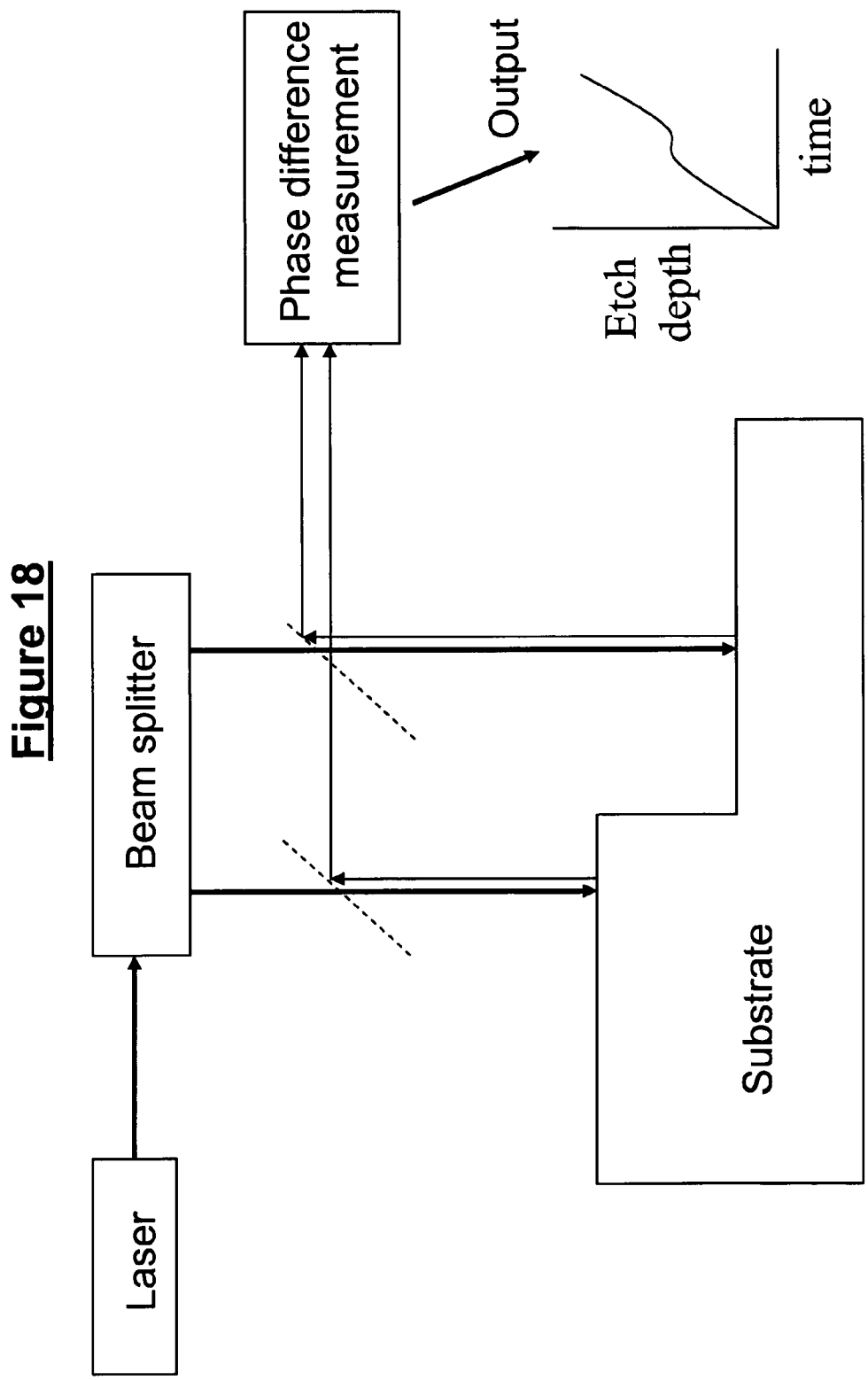
FIG. 18 is a shows a simplified schematic of the use of an interferometer in a TDM silicon etch process.

It is known in the art to measure the depth of features during a TDM silicon etch process using a twin spot interferometric camera (e.g., Jobin Yvon Horiba's TDM-200). FIG. 18 shows a simplified schematic of the interferometric camera and its typical application to TDM silicon etch processes. In this configuration, one of the laser beams is place on the feature of interest while the other beam is positioned on a masked portion of the substrate. During the course of the etch, the path length of the beam over the feature to be etched increases causing a phase difference between itself and the reference beam positioned on the masked surface. In this configuration it is possible to monitor both the etch rate and etch depth of the feature relative to the masked surface. The TDM-200 has a typical beam diameter of 30 μm with a typical beam separation of 240 μm.

Figure 19:
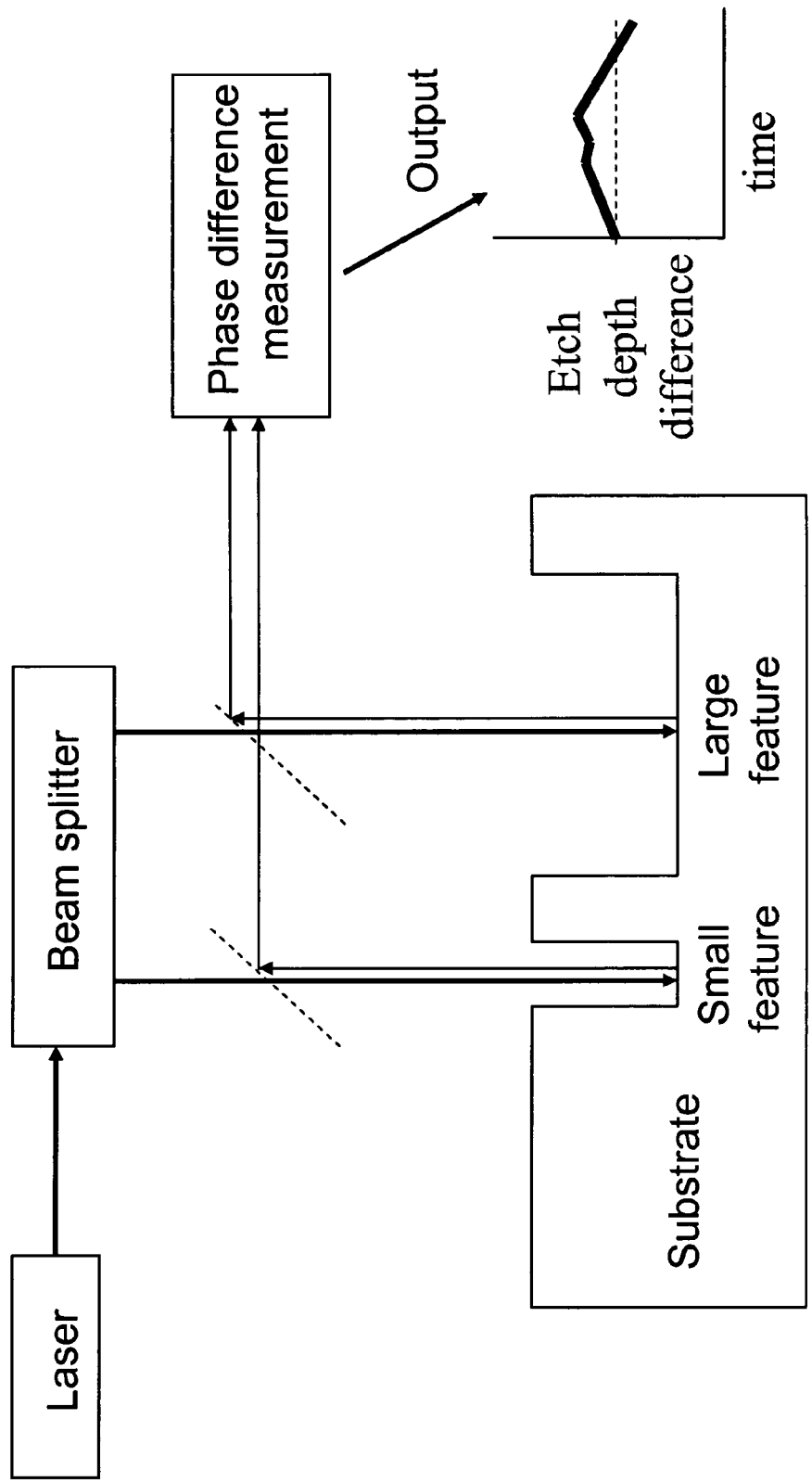
FIG. 19 is a shows a simplified schematic of the use of an interferometer in a TDM silicon etch process in a configuration to measure etch depth difference.

The inventors have found that etch depth difference between two different size features can be measured through the use of the twin spot interferometric camera. FIG. 19 shows a simplified schematic of the interferometric camera in a configuration to measure etch depth difference. Ideally the laser beams will fit within the features to be measured, though positioning the laser beam over a dense array of features with dimensions smaller than the beam diameter will also work. In this configuration the camera will measure etch depth difference of the two features, but not the individual feature etch rates or absolute etch depth. A camera equipped with three or more beam (one on the mask surface, one in the narrower feature and one in the wider feature) will allow simultaneous measurement of absolute etch depth, etch rate difference, and etch rate for two or more features.

It is useful to incorporate a test feature within the device mask to facilitate the ARDE measurement. In the case of the twin spot interferometric camera it is useful to construct a test feature that consists of an open circle centered in a ring. The dimension of the circle can correspond to the widest feature of interest. The thickness of the ring can correspond to the narrowest feature size of interest. The radius of the ring can correspond to the distance between the two laser beams. If the width of the outer ring is less than the laser spot size, a series of concentric rings or a ring shaped array of features can be used to improve the signal to noise of the etch depth difference measurement.

Alternatively, the test pattern can consist of a dense array of holes. The hole dimension can be less than the beam dimension. The dimension of the array should be larger than the beam. The centers of the arrays of the wider and narrower features should ideally be the same distance apart as the twin beam spacing.

The ability to measure the etch depth difference between wide and narrow features in real time during the process allows for a number of control schemes for controlling ARDE.

In the present invention, a real time metrology method (e.g., twin spot interferometric camera) is used to monitor the etch of two different size features over time, calculate an etch depth difference signal, feed the signal back to a process controller, and adjust the TDM process to minimize differences in etch depth between the monitored features.

Figure 20:
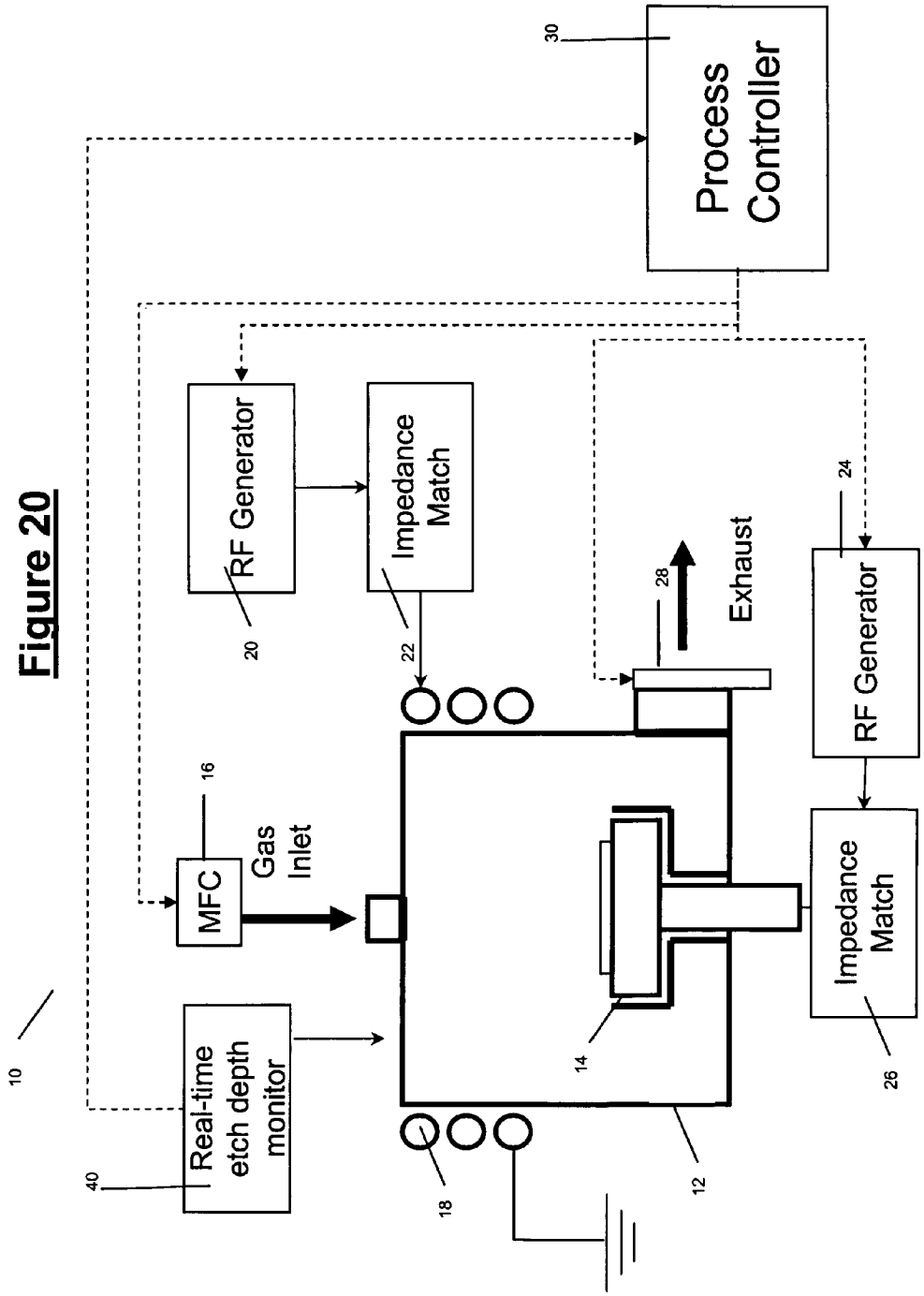
FIG. 20 is a schematic of a plasma reactor configured for providing real time ARDE control in a TDM process.

FIG. 20 shows a schematic of a plasma reactor 10 configured to real time control of ARDE during a TDM process. A TDM processing chamber consists of a vacuum chamber 12 with a substrate support 14 within the chamber 12, a gas supply source 16 for introducing process gases, a high density plasma source 18 to generate a plasma, a first voltage supply 20 with a first impedance match 22 to apply a voltage to high density plasma source 18, a second voltage supply 24 (either DC or RF with impedance match 26) to apply a voltage to the substrate support 14, a mechanism for pressure control (e.g., throttle valve), an exhaust 28 to evacuate the chamber 12, and a process controller 30 to maintain the desired process set points (e.g., gas flows, pressures, voltages, etc.). A real-time etch depth difference monitor 40 (e.g., twin beam interferometric camera) measures the etch depth difference between at least two different feature sizes. The etch depth difference is compared to the desired etch depth difference. If the difference between the measured value and the desired value is greater than the allowed error tolerance, the process controller adjusts the process during the current or subsequent TDM cycle(s) to attain the desired etch depth difference value.

Figure 21:
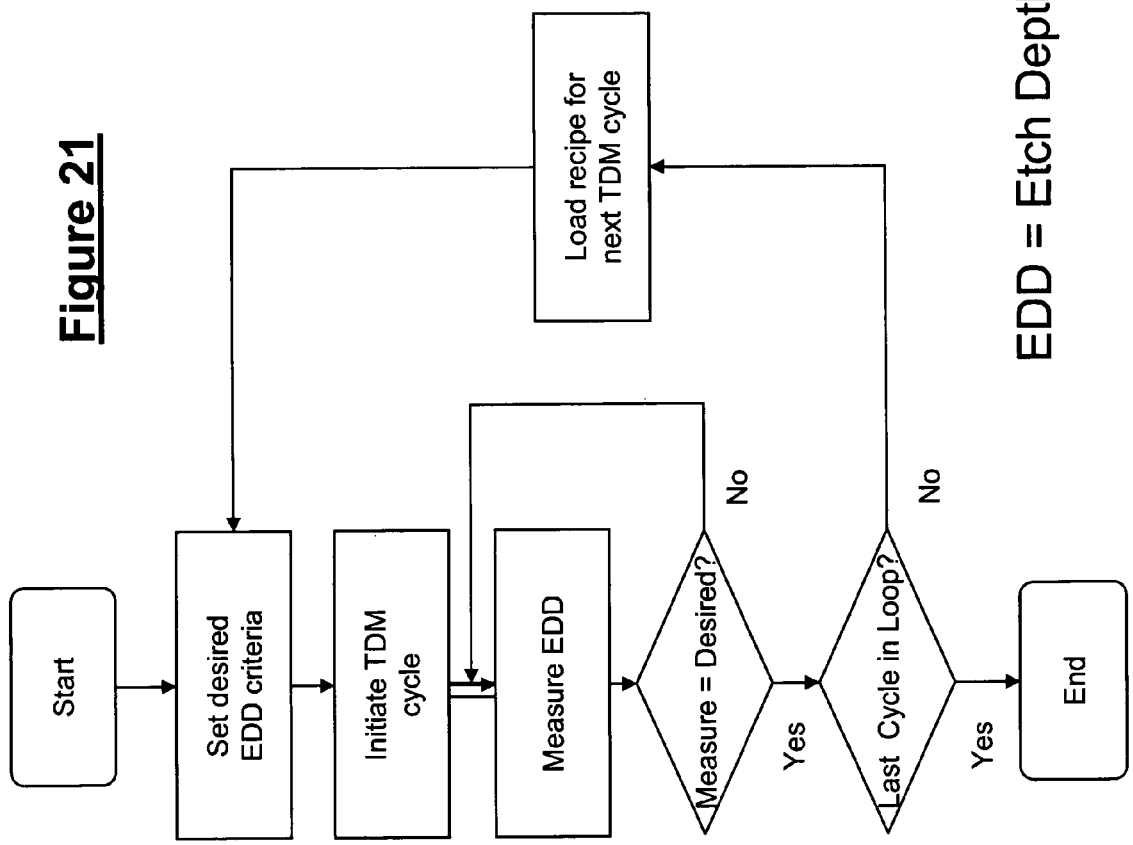
FIG. 21 is a flow chart of a process control algorithm to maintain the etch depth difference between at least two features at the end of each TDM cycle.

One method for adjusting the TDM process is a process control algorithm to maintain the etch depth difference between at least two features at the end of each TDM cycle through adjustment of the etch step (or sub-step) etch time. A flow chart for this method is shown in FIG. 21. In this method the desired etch depth difference (EDD) between the two features is determined either through a user entered value, or a direct measure of the current EDD between the features. Typically the desired EDD value is zero (no ARDE). Once the desired value has been chosen, the TDM process is initiated. During the course of the TDM cycle, the EDD between the difference is measured and compared to the desired value. For a two step (deposition & etch) TDM silicon etch, the etch depth difference will follow a curve similar to FIG. 17. At the beginning of the etch step of a TDM cycle the EDD (narrow feature—wide feature) will be greater than zero. As the etch step(s) proceeds the EDD will obtain a negative slope with a value greater than zero. For the case where the desired EDD value is zero, the controller monitors the EDD and terminates the etch step when the EDD value is measured to be zero (or the desired value). In this configuration the controller Controls the EDD within a cycle.

It is important to note that the above examples assume the existence of conventional ARDE (higher aspect ratio features etch slower). Inverse ARDE has been observed using the TDM silicon etch process. A similar approach can be used to measure and correct for inverse ARDE during TDM silicon etching.

Figure 22:
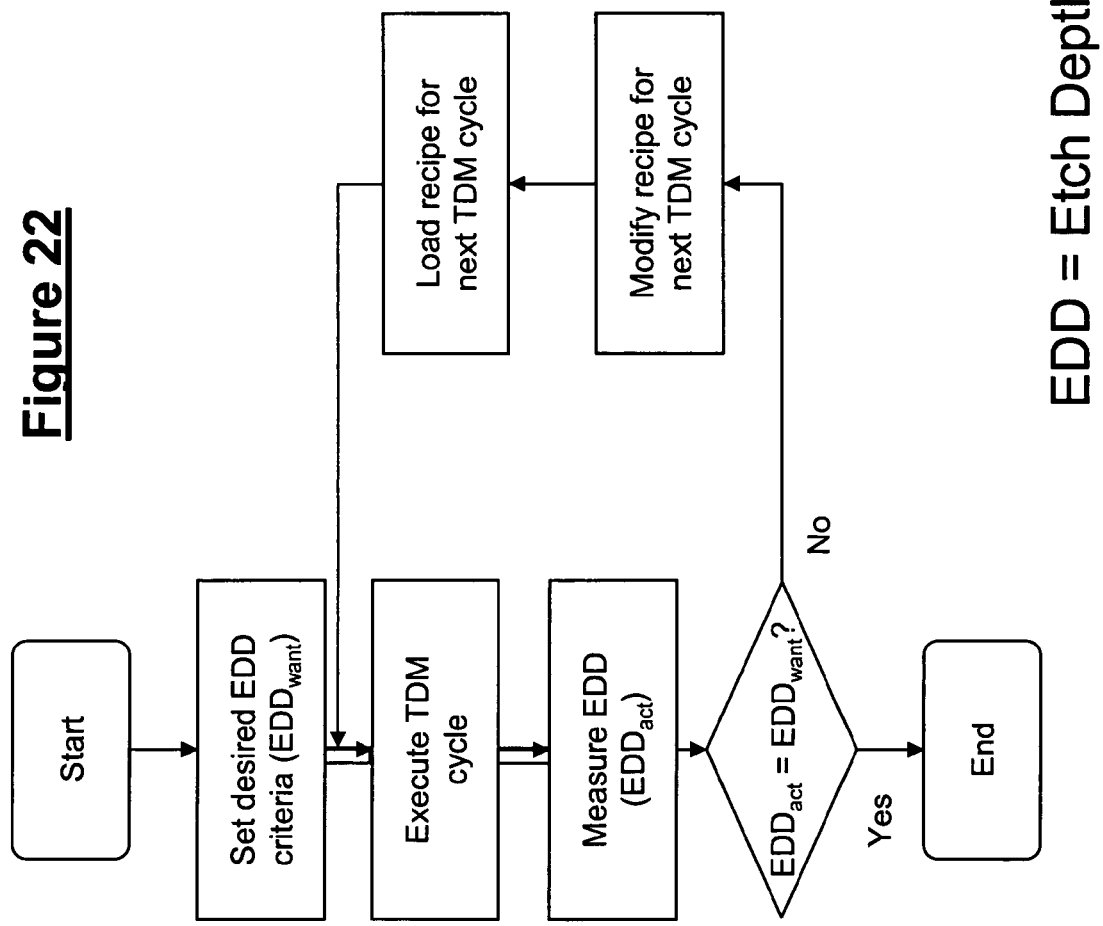
FIG. 22 is a flow chart of another process control algorithm to maintain the etch depth difference between at least two features at the end of each TDM cycle.

FIG. 22 shows a flow chart of an alternative real-time ARDE control algorithm for adjusting the TDM process. In this case, the EDD criteria is set, a user specified TDM cycle is executed, the EDD is measured during the TDM cycle, the measured EDD is compared to the desire EDD. If there is a difference, the software controller modifies the cycle recipe to minimize the difference between EDD measured and EDD actual. In this configuration, the controller controls EDD cycle-to-cycle in the TDM process.

The above examples discuss ARDE minimization for a TDM silicon etch process. It is important to note that the in-line metrology and process feedback algorithm can be applied to a number of material systems including compound semiconductors (e.g., GaAs, InP, SiGe, etc.), metals (e.g., Al, Mo, Ti, Ta, W, Cr) and dielectrics (e.g. SiN, polymers, etc.). Furthermore, the method is not necessarily limited in application to TDM processes and may be applied to conventional processes.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

We claim:

1. A method for reducing aspect ratio dependent etching in a plasma etching process, the method comprising:
   placing a substrate in a vacuum chamber;
   setting a desired etch depth difference of different sized features on said substrate;
   depositing a passivation layer on said substrate by means of a plasma;
   removing at least a portion of said passivation layer by means of a plasma;
   etching a material from said substrate by means of a plasma;
   performing a process loop of repeating the deposition step, the removal step, and the etch step;
   monitoring the etching of said different sized features on said substrate in real time;
   measuring a current etch depth difference between said different sized features based on said monitoring step;
   comparing the current etch depth difference of said different sized features on said substrate to said desired etch depth difference of said different sized features on said substrate;
   adjusting the process loop step based on said comparison step, thereby minimizing the differences in the etch depth between the monitored different sized features on said substrate; and
   removing the substrate from the vacuum chamber.

2. The method of claim 1 wherein said monitoring step further comprising:
   generating an initial signal from a differential interferometer;
   evaluating said initial signal prior to initiating said process loop step;
   generating a process signal from said differential interferometer during said process loop step;
   comparing said process signal to said initial signal; and
   terminating the process loop step when said process signal is about equal to said initial signal.

3. The method of claim 1 wherein said etch step further comprises a plurality of sub-steps.

4. The method of claim 1 wherein said etch step further comprises at least one isotropic sub-step.

* * * * *